United States Patent
Goettfert

(10) Patent No.: US 10,236,916 B2
(45) Date of Patent: Mar. 19, 2019

(54) METHOD AND DECODER FOR DETERMINING AN ERROR VECTOR FOR A DATA WORD ACCORDING TO A REED-MULLER CODE

(71) Applicant: Infineon Technologies AG, Neubiberg (DE)

(72) Inventor: Rainer Goettfert, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 44 days.

(21) Appl. No.: 15/214,480

(22) Filed: Jul. 20, 2016

(65) Prior Publication Data

US 2017/0026057 A1 Jan. 26, 2017

(30) Foreign Application Priority Data

Jul. 20, 2015 (DE) .................. 10 2015 111 729

(51) Int. Cl.
*H03M 13/13* (2006.01)
*H03M 13/15* (2006.01)
*H03M 13/43* (2006.01)

(52) U.S. Cl.
CPC ......... *H03M 13/43* (2013.01); *H03M 13/136* (2013.01); *H03M 13/155* (2013.01);
(Continued)

(58) Field of Classification Search
CPC ............... H03M 13/43; H03M 13/136; H03M 13/1575; H03M 13/1128; H03M 13/116;
(Continued)

(56) References Cited

U.S. PATENT DOCUMENTS

| 6,381,713 B1 * | 4/2002 | Irvin | ........... | H04L 1/0057 |
| | | | | 370/314 |
| 7,584,406 B2 * | 9/2009 | Niu | ........... | H03M 13/1102 |
| | | | | 714/790 |

(Continued)

OTHER PUBLICATIONS

Reed, "A class of multiple-error-correcting codes and the decoding scheme", Transactions of the IRE Professional Group on Information Theory, 1954, pp. 38-49, vol. 4, Issue 4, IEEE Information Theory Society.

(Continued)

*Primary Examiner* — James C Kerveros
(74) *Attorney, Agent, or Firm* — Viering, Jentschura & Partner mbB

(57) ABSTRACT

A method for determining an error vector for a data word according to a Reed-Muller Code includes determining the syndrome of the error vector according to the Reed-Muller Code, expanding the syndrome with zeroes to 1 bit length less than the length of the Reed-Muller Code, determining a code word of a Simplex Code of 1 bit length less than the length of the Reed-Muller Code whose difference to the expanded syndrome has a weight below a first threshold or equal to or above a second threshold, expanding the difference between the determined code word and the expanded syndrome by a zero, and outputting the expanded difference as error vector if its weight is below the first threshold or outputting the inverted expanded difference as error vector if the weight of the expanded difference is equal to or above the second threshold.

17 Claims, 22 Drawing Sheets

(52) U.S. Cl.
CPC ...... *H03M 13/1575* (2013.01); *H03M 13/152* (2013.01); *H03M 13/1515* (2013.01)

(58) Field of Classification Search
CPC ............. H03M 13/3715; H03M 13/09; H03M 13/112; H03M 13/2951; H03M 13/3738; H03M 3/155; H03M 13/152; H03M 3/1515
USPC .................................................. 714/785, 793
See application file for complete search history.

(56) References Cited

U.S. PATENT DOCUMENTS

| | | | | |
|---|---|---|---|---|
| 8,572,465 B2* | 10/2013 | Uchikawa | ............... | G06F 11/10 714/774 |
| 8,732,564 B2* | 5/2014 | Chinnici | ............ | H03M 13/1111 714/752 |
| 8,769,380 B1 | 7/2014 | Burd et al. | | |
| 2007/0101229 A1* | 5/2007 | Niu | .................... | H03M 13/1102 714/752 |
| 2010/0329308 A1* | 12/2010 | Kim | ..................... | H03M 13/11 375/130 |
| 2011/0219284 A1* | 9/2011 | Uchikawa | ............... | G06F 11/10 714/763 |
| 2011/0283166 A1* | 11/2011 | Kim | ....................... | G06F 11/106 714/773 |
| 2012/0297267 A1* | 11/2012 | Chinnici | ............ | H03M 13/1111 714/755 |
| 2013/0031440 A1* | 1/2013 | Sharon | ................ | G06F 11/1012 714/758 |
| 2015/0100854 A1* | 4/2015 | Lu | ........................ | G06F 11/1048 714/773 |
| 2015/0188570 A1* | 7/2015 | Kwok | ................. | G06F 11/1076 714/764 |
| 2015/0286523 A1* | 10/2015 | Cai | .................... | G11B 20/1833 714/807 |

OTHER PUBLICATIONS

Green, "A serial orthogonal decoder", JPL Space Programs Summary, 1966, pp. 247-253, No. 37-39, vol. IV.
Puchinger et al., "On Error Correction for Physical Unclonable Functions", Jan. 2015, 6pages.

* cited by examiner

FIG 14

1401
| Time: t=0 | | | | | | | | | | | | | | |
|---|---|---|---|---|---|---|---|---|---|---|---|---|---|---|
| Reg. 1: | 0 | 0 | 1 | 0 | 0 | 0 | 1 | 1 | 1 | 1 | 0 | 1 | 0 | 1 | 1 |
| Reg. 2: | 0 | 0 | 0 | 0 | 1 | 0 | 0 | 0 | 0 | 1 | 0 | 1 | 1 | 1 | 1 |
| Reg. 3: | 0 | 0 | 1 | 0 | 1 | 0 | 1 | 1 | 1 | 0 | 0 | 0 | 1 | 0 | 0 |
| Result: w=6; repeat | | | | | | | | | | | | | | |

1402
| Time: t=1 | | | | | | | | | | | | | | |
|---|---|---|---|---|---|---|---|---|---|---|---|---|---|---|
| Reg. 1: | 0 | 1 | 0 | 0 | 0 | 1 | 1 | 1 | 1 | 0 | 1 | 0 | 1 | 1 | 0 |
| Reg. 2: | 0 | 0 | 0 | 0 | 1 | 0 | 0 | 0 | 0 | 1 | 0 | 1 | 1 | 1 | 1 |
| Reg. 3: | 0 | 1 | 0 | 0 | 1 | 1 | 1 | 1 | 1 | 1 | 1 | 1 | 0 | 0 | 1 |
| Result: w=10; repeat | | | | | | | | | | | | | | |

1403
| Time: t=6 | | | | | | | | | | | | | | |
|---|---|---|---|---|---|---|---|---|---|---|---|---|---|---|
| Reg. 1: | 1 | 1 | 1 | 1 | 0 | 1 | 0 | 1 | 1 | 0 | 0 | 1 | 0 | 0 | 0 |
| Reg. 2: | 0 | 0 | 0 | 0 | 1 | 0 | 0 | 0 | 0 | 1 | 0 | 1 | 1 | 1 | 1 |
| Reg. 3: | 1 | 1 | 1 | 1 | 1 | 1 | 0 | 1 | 1 | 1 | 0 | 0 | 1 | 1 | 1 |
| Result: w=12; stop! | | | | | | | | | | | | | | |

| Time: t=0 | | | | | | | | | | | | | | |
|---|---|---|---|---|---|---|---|---|---|---|---|---|---|---|
| Reg. 1: | 0 | 0 | 1 | 0 | 0 | 0 | 1 | 1 | 1 | 0 | 1 | 0 | 1 | 1 |
| Reg. 2: | 0 | 0 | 0 | 0 | 1 | 0 | 1 | 0 | 1 | 0 | 1 | 0 | 0 | 0 |
| Reg. 3: | 0 | 0 | 1 | 0 | 1 | 0 | 0 | 1 | 0 | 1 | 1 | 1 | 0 | 1 | 1 |
| Result: w=8; | | | | | | | | | | | | | | |

1502

| Time: t=1 | | | | | | | | | | | | | | |
|---|---|---|---|---|---|---|---|---|---|---|---|---|---|---|
| Reg. 1: | 0 | 1 | 0 | 0 | 0 | 1 | 1 | 1 | 1 | 0 | 1 | 0 | 1 | 1 | 0 |
| Reg. 2: | 0 | 0 | 0 | 0 | 1 | 0 | 1 | 0 | 1 | 0 | 1 | 0 | 0 | 0 |
| Reg. 3: | 0 | 1 | 0 | 0 | 1 | 1 | 0 | 1 | 0 | 0 | 0 | 0 | 1 | 1 | 0 |
| Result: w=6; | | | | | | | | | | | | | | |

1503

| Time: t=2 | | | | | | | | | | | | | | |
|---|---|---|---|---|---|---|---|---|---|---|---|---|---|---|
| Reg. 1: | 1 | 0 | 0 | 0 | 1 | 1 | 1 | 0 | 1 | 0 | 1 | 1 | 0 | 0 |
| Reg. 2: | 0 | 0 | 0 | 0 | 1 | 0 | 1 | 0 | 1 | 0 | 1 | 0 | 0 | 0 |
| Reg. 3: | 1 | 0 | 0 | 0 | 0 | 1 | 0 | 1 | 1 | 1 | 1 | 1 | 1 | 0 | 0 |
| Result: w=6; repeat | | | | | | | | | | | | | | |

1504

| Time: t=3 | | | | | | | | | | | | | | |
|---|---|---|---|---|---|---|---|---|---|---|---|---|---|---|
| Reg. 1: | 0 | 0 | 0 | 1 | 1 | 1 | 1 | 0 | 1 | 0 | 1 | 0 | 0 | 1 |
| Reg. 2: | 0 | 0 | 0 | 0 | 1 | 0 | 1 | 0 | 1 | 0 | 1 | 0 | 0 | 0 |
| Reg. 3: | 0 | 0 | 0 | 1 | 0 | 1 | 0 | 0 | 0 | 0 | 0 | 1 | 0 | 0 | 1 |
| Result: w=4; | | | | | | | | | | | | | | |

1505

| Time: t=4 | | | | | | | | | | | | | | |
|---|---|---|---|---|---|---|---|---|---|---|---|---|---|---|
| Reg. 1: | 0 | 0 | 1 | 1 | 1 | 1 | 0 | 1 | 0 | 1 | 1 | 0 | 0 | 1 | 0 |
| Reg. 2: | 0 | 0 | 0 | 0 | 1 | 0 | 1 | 0 | 1 | 0 | 1 | 0 | 0 | 0 |
| Reg. 3: | 0 | 0 | 1 | 1 | 0 | 1 | 1 | 1 | 1 | 1 | 0 | 0 | 0 | 1 | 0 |
| Result: w=8; | | | | | | | | | | | | | | |

| Time: t=5 | | | | | | | | | | | | | | |
|---|---|---|---|---|---|---|---|---|---|---|---|---|---|---|
| Reg. 1: | 0 | 1 | 1 | 1 | 1 | 0 | 1 | 0 | 1 | 1 | 0 | 0 | 1 | 0 | 0 |
| Reg. 2: | 0 | 0 | 0 | 0 | 1 | 0 | 1 | 0 | 1 | 0 | 1 | 0 | 0 | 0 | 0 |
| Reg. 3: | 0 | 1 | 1 | 1 | 0 | 0 | 0 | 0 | 1 | 1 | 0 | 1 | 0 | 0 |
| Result: w=6; | | | | | | | | | | | | | | |

1507

| Time: t=6 | | | | | | | | | | | | | | |
|---|---|---|---|---|---|---|---|---|---|---|---|---|---|---|
| Reg. 1: | 1 | 1 | 1 | 1 | 0 | 1 | 0 | 1 | 1 | 0 | 0 | 1 | 0 | 0 | 0 |
| Reg. 2: | 0 | 0 | 0 | 0 | 1 | 0 | 1 | 0 | 1 | 0 | 1 | 0 | 0 | 0 | 0 |
| Reg. 3: | 1 | 1 | 1 | 1 | 1 | 1 | 1 | 1 | 0 | 0 | 1 | 1 | 0 | 0 | 0 |
| Result: w=10; | | | | | | | | | | | | | | |

1508

| Time: t=7 | | | | | | | | | | | | | | |
|---|---|---|---|---|---|---|---|---|---|---|---|---|---|---|
| Reg. 1: | 1 | 1 | 1 | 0 | 1 | 0 | 1 | 1 | 0 | 0 | 1 | 0 | 0 | 0 | 1 |
| Reg. 2: | 0 | 0 | 0 | 0 | 1 | 0 | 1 | 0 | 1 | 0 | 1 | 0 | 0 | 0 | 0 |
| Reg. 3: | 1 | 1 | 1 | 0 | 0 | 0 | 0 | 1 | 1 | 0 | 0 | 0 | 0 | 1 |
| Result: w=6; | | | | | | | | | | | | | | |

1509

| Time: t=8 | | | | | | | | | | | | | | |
|---|---|---|---|---|---|---|---|---|---|---|---|---|---|---|
| Reg. 1: | 1 | 1 | 0 | 1 | 0 | 1 | 1 | 0 | 0 | 1 | 0 | 0 | 0 | 1 | 1 |
| Reg. 2: | 0 | 0 | 0 | 0 | 1 | 0 | 1 | 0 | 1 | 0 | 1 | 0 | 0 | 0 | 0 |
| Reg. 3: | 1 | 1 | 0 | 1 | 1 | 1 | 0 | 0 | 1 | 1 | 1 | 0 | 0 | 1 | 1 |
| Result: w=10; | | | | | | | | | | | | | | |

1510

| Time: t=9 | | | | | | | | | | | | | | |
|---|---|---|---|---|---|---|---|---|---|---|---|---|---|---|
| Reg. 1: | 1 | 0 | 1 | 0 | 1 | 1 | 0 | 0 | 1 | 0 | 0 | 0 | 1 | 1 | 1 |
| Reg. 2: | 0 | 0 | 0 | 0 | 1 | 0 | 1 | 0 | 1 | 0 | 1 | 0 | 0 | 0 | 0 |
| Reg. 3: | 1 | 0 | 1 | 0 | 1 | 1 | 0 | 0 | 0 | 1 | 0 | 1 | 1 | 1 |
| Result: w=8; | | | | | | | | | | | | | | |

FIG 15C

1511 — Time: t=10

| Reg. 1: | 0 | 1 | 0 | 1 | 1 | 0 | 0 | 1 | 0 | 0 | 1 | 1 | 1 | 1 |
|---|---|---|---|---|---|---|---|---|---|---|---|---|---|---|
| Reg. 2: | 0 | 0 | 0 | 0 | 1 | 0 | 1 | 0 | 1 | 0 | 1 | 0 | 0 | 0 |
| Reg. 3: | 0 | 1 | 0 | 1 | 0 | 0 | 1 | 1 | 1 | 0 | 1 | 1 | 1 | 1 |

Result: w=10;

1512 — Time: t=11

| Reg. 1: | 1 | 0 | 1 | 1 | 0 | 0 | 1 | 0 | 0 | 0 | 1 | 1 | 1 | 0 |
|---|---|---|---|---|---|---|---|---|---|---|---|---|---|---|
| Reg. 2: | 0 | 0 | 0 | 0 | 1 | 0 | 1 | 0 | 1 | 0 | 1 | 0 | 0 | 0 |
| Reg. 3: | 1 | 0 | 1 | 1 | 1 | 0 | 0 | 0 | 1 | 0 | 0 | 1 | 1 | 0 |

Result: w=8;

1513 — Time: t=12

| Reg. 1: | 0 | 1 | 1 | 0 | 0 | 1 | 0 | 0 | 1 | 1 | 1 | 1 | 0 | 1 |
|---|---|---|---|---|---|---|---|---|---|---|---|---|---|---|
| Reg. 2: | 0 | 0 | 0 | 0 | 1 | 0 | 1 | 0 | 1 | 0 | 1 | 0 | 0 | 0 |
| Reg. 3: | 0 | 1 | 1 | 0 | 1 | 1 | 1 | 0 | 1 | 1 | 0 | 1 | 1 | 0 | 1 |

Result: w=10;

1514 — Time: t=13

| Reg. 1: | 1 | 1 | 0 | 0 | 1 | 0 | 0 | 1 | 1 | 1 | 1 | 0 | 1 | 0 |
|---|---|---|---|---|---|---|---|---|---|---|---|---|---|---|
| Reg. 2: | 0 | 0 | 0 | 0 | 1 | 0 | 1 | 0 | 1 | 0 | 1 | 0 | 0 | 0 |
| Reg. 3: | 1 | 1 | 0 | 0 | 0 | 0 | 1 | 0 | 0 | 1 | 0 | 1 | 0 | 1 | 0 |

Result: w=6;

1515 — Time: t=14

| Reg. 1: | 1 | 0 | 0 | 1 | 0 | 0 | 0 | 1 | 1 | 1 | 1 | 0 | 1 | 0 | 1 |
|---|---|---|---|---|---|---|---|---|---|---|---|---|---|---|---|
| Reg. 2: | 0 | 0 | 0 | 0 | 1 | 0 | 1 | 0 | 1 | 0 | 1 | 0 | 0 | 0 |
| Reg. 3: | 1 | 0 | 0 | 1 | 1 | 0 | 1 | 1 | 0 | 1 | 0 | 0 | 1 | 0 | 1 |

Result: w=8.

FIG 16A

1601 — Time: t=0

| Reg. 1: | 0 | 0 | 1 | 0 | 0 | 0 | 1 | 1 | 1 | 1 | 0 | 1 | 0 | 1 | 1 |
|---|---|---|---|---|---|---|---|---|---|---|---|---|---|---|---|
| Reg. 2: | 0 | 0 | 0 | 0 | 0 | 0 | 0 | 0 | 0 | 1 | 0 | 0 | 1 | 0 | 1 |
| Reg. 3: | 0 | 0 | 1 | 0 | 0 | 0 | 1 | 1 | 1 | 1 | 0 | 1 | 1 | 1 | 0 |

Result: w=7;

1602 — Time: t=1

| Reg. 1: | 0 | 1 | 0 | 0 | 0 | 1 | 1 | 1 | 1 | 0 | 1 | 0 | 1 | 1 | 0 |
|---|---|---|---|---|---|---|---|---|---|---|---|---|---|---|---|
| Reg. 2: | 0 | 0 | 0 | 0 | 0 | 0 | 0 | 0 | 0 | 1 | 0 | 0 | 1 | 0 | 1 |
| Reg. 3: | 0 | 1 | 0 | 0 | 0 | 1 | 1 | 1 | 1 | 1 | 1 | 0 | 0 | 1 | 1 |

Result: w=9;

1603 — Time: t=2

| Reg. 1: | 1 | 0 | 0 | 0 | 1 | 1 | 1 | 0 | 1 | 0 | 1 | 1 | 0 | 0 |
|---|---|---|---|---|---|---|---|---|---|---|---|---|---|---|
| Reg. 2: | 0 | 0 | 0 | 0 | 0 | 0 | 0 | 0 | 1 | 0 | 0 | 1 | 0 | 1 |
| Reg. 3: | 1 | 0 | 0 | 0 | 1 | 1 | 1 | 0 | 0 | 0 | 1 | 0 | 0 | 1 |

Result: w=7; repeat

1604 — Time: t=3

| Reg. 1: | 0 | 0 | 0 | 1 | 1 | 1 | 0 | 1 | 0 | 1 | 1 | 0 | 0 | 1 |
|---|---|---|---|---|---|---|---|---|---|---|---|---|---|---|
| Reg. 2: | 0 | 0 | 0 | 0 | 0 | 0 | 0 | 0 | 1 | 0 | 0 | 1 | 0 | 1 |
| Reg. 3: | 0 | 0 | 0 | 1 | 1 | 1 | 0 | 1 | 1 | 1 | 1 | 1 | 0 | 0 |

Result: w=9;

1605 — Time: t=4

| Reg. 1: | 0 | 0 | 1 | 1 | 1 | 0 | 1 | 0 | 1 | 1 | 0 | 0 | 1 | 0 |
|---|---|---|---|---|---|---|---|---|---|---|---|---|---|---|
| Reg. 2: | 0 | 0 | 0 | 0 | 0 | 0 | 0 | 0 | 1 | 0 | 1 | 0 | 1 |  |
| Reg. 3: | 0 | 0 | 1 | 1 | 1 | 0 | 1 | 0 | 0 | 1 | 0 | 1 | 1 | 1 |

Result: w=9;

| Time: t=5 | | | | | | | | | | | | | |
|---|---|---|---|---|---|---|---|---|---|---|---|---|---|
| Reg. 1: | 0 | 1 | 1 | 1 | 1 | 0 | 1 | 0 | 1 | 1 | 0 | 0 | 1 | 0 | 0 |
| Reg. 2: | 0 | 0 | 0 | 0 | 0 | 0 | 0 | 0 | 0 | 1 | 0 | 0 | 1 | 0 | 1 |
| Reg. 3: | 0 | 1 | 1 | 1 | 1 | 0 | 1 | 0 | 1 | 0 | 0 | 0 | 0 | 0 | 1 |
| Result: w=7; | | | | | | | | | | | | | |

1607

| Time: t=6 | | | | | | | | | | | | | |
|---|---|---|---|---|---|---|---|---|---|---|---|---|---|
| Reg. 1: | 1 | 1 | 1 | 1 | 0 | 1 | 0 | 1 | 1 | 0 | 0 | 1 | 0 | 0 | 0 |
| Reg. 2: | 0 | 0 | 0 | 0 | 0 | 0 | 0 | 0 | 0 | 1 | 0 | 0 | 1 | 0 | 1 |
| Reg. 3: | 1 | 1 | 1 | 1 | 0 | 1 | 0 | 1 | 1 | 1 | 0 | 1 | 1 | 0 | 1 |
| Result: w=11; | | | | | | | | | | | | | |

1608

| Time: t=7 | | | | | | | | | | | | | |
|---|---|---|---|---|---|---|---|---|---|---|---|---|---|
| Reg. 1: | 1 | 1 | 1 | 0 | 1 | 0 | 1 | 1 | 0 | 0 | 1 | 0 | 0 | 0 | 1 |
| Reg. 2: | 0 | 0 | 0 | 0 | 0 | 0 | 0 | 0 | 0 | 1 | 0 | 0 | 1 | 0 | 1 |
| Reg. 3: | 1 | 1 | 1 | 0 | 1 | 0 | 1 | 1 | 0 | 1 | 1 | 0 | 1 | 0 | 0 |
| Result: w=9; | | | | | | | | | | | | | |

1609

| Time: t=8 | | | | | | | | | | | | | |
|---|---|---|---|---|---|---|---|---|---|---|---|---|---|
| Reg. 1: | 1 | 1 | 0 | 1 | 0 | 1 | 1 | 0 | 0 | 1 | 0 | 0 | 0 | 1 | 1 |
| Reg. 2: | 0 | 0 | 0 | 0 | 0 | 0 | 0 | 0 | 0 | 1 | 0 | 0 | 1 | 0 | 1 |
| Reg. 3: | 1 | 1 | 0 | 1 | 0 | 1 | 1 | 0 | 0 | 0 | 0 | 0 | 1 | 1 | 0 |
| Result: w=7; | | | | | | | | | | | | | |

1610

| Time: t=9 | | | | | | | | | | | | | |
|---|---|---|---|---|---|---|---|---|---|---|---|---|---|
| Reg. 1: | 1 | 0 | 1 | 0 | 1 | 1 | 0 | 0 | 1 | 0 | 0 | 0 | 1 | 1 | 1 |
| Reg. 2: | 0 | 0 | 0 | 0 | 0 | 0 | 0 | 0 | 0 | 1 | 0 | 0 | 1 | 0 | 1 |
| Reg. 3: | 1 | 0 | 1 | 0 | 1 | 1 | 0 | 0 | 1 | 1 | 0 | 0 | 0 | 1 | 0 |
| Result: w=7; | | | | | | | | | | | | | |

FIG 16C

1611 — Time: t=10
| Reg. 1: | 0 | 1 | 0 | 1 | 1 | 0 | 0 | 1 | 0 | 0 | 0 | 1 | 1 | 1 | 1 |
|---|---|---|---|---|---|---|---|---|---|---|---|---|---|---|---|
| Reg. 2: | 0 | 0 | 0 | 0 | 0 | 0 | 0 | 0 | 0 | 1 | 0 | 0 | 1 | 0 | 1 |
| Reg. 3: | 0 | 1 | 0 | 1 | 1 | 0 | 0 | 1 | 0 | 1 | 0 | 1 | 1 | 0 | 1 | 0 |

Result: w=7;

1612 — Time: t=11
| Reg. 1: | 1 | 0 | 1 | 1 | 0 | 0 | 1 | 0 | 0 | 0 | 1 | 1 | 1 | 1 | 0 |
|---|---|---|---|---|---|---|---|---|---|---|---|---|---|---|---|
| Reg. 2: | 0 | 0 | 0 | 0 | 0 | 0 | 0 | 0 | 0 | 1 | 0 | 0 | 1 | 0 | 1 |
| Reg. 3: | 1 | 0 | 1 | 1 | 0 | 0 | 1 | 0 | 0 | 1 | 1 | 1 | 0 | 1 | 1 |

Result: w=9;

1613 — Time: t=12
| Reg. 1: | 0 | 1 | 1 | 0 | 0 | 1 | 0 | 0 | 0 | 1 | 1 | 1 | 1 | 0 | 1 |
|---|---|---|---|---|---|---|---|---|---|---|---|---|---|---|---|
| Reg. 2: | 0 | 0 | 0 | 0 | 0 | 0 | 0 | 0 | 0 | 1 | 0 | 0 | 1 | 0 | 1 |
| Reg. 3: | 0 | 1 | 1 | 0 | 0 | 1 | 0 | 0 | 0 | 1 | 1 | 0 | 0 | 0 |

Result: w=5;

1614 — Time: t=13
| Reg. 1: | 1 | 1 | 0 | 0 | 1 | 0 | 0 | 0 | 1 | 1 | 1 | 1 | 0 | 1 | 0 |
|---|---|---|---|---|---|---|---|---|---|---|---|---|---|---|---|
| Reg. 2: | 0 | 0 | 0 | 0 | 0 | 0 | 0 | 0 | 1 | 0 | 0 | 1 | 0 | 1 |
| Reg. 3: | 1 | 1 | 0 | 0 | 1 | 0 | 0 | 0 | 1 | 0 | 1 | 1 | 1 | 1 | 1 |

Result: w=9;

1615 — Time: t=14
| Reg. 1: | 1 | 0 | 0 | 1 | 0 | 0 | 0 | 1 | 1 | 1 | 1 | 0 | 1 | 0 | 1 |
|---|---|---|---|---|---|---|---|---|---|---|---|---|---|---|---|
| Reg. 2: | 0 | 0 | 0 | 0 | 0 | 0 | 0 | 0 | 1 | 0 | 0 | 1 | 0 | 1 |
| Reg. 3: | 1 | 0 | 0 | 1 | 0 | 0 | 0 | 1 | 1 | 0 | 1 | 0 | 0 | 0 | 0 |

Result: w=5;

FIG 17

1701 — Time: t=0

| Reg. 1: | 0 | 0 | 1 | 0 | 0 | 0 | 1 | 1 | 1 | 1 | 0 | 1 | 0 | 1 | 1 |
| Reg. 2: | 0 | 0 | 0 | 0 | 0 | 1 | 1 | 0 | 1 | 1 | 1 | 0 | 1 | 0 | 1 |
| Reg. 3: | 0 | 0 | 1 | 0 | 0 | 1 | 0 | 1 | 0 | 0 | 1 | 1 | 1 | 1 | 0 |

Result: w=7;

1702 — Time: t=1

| Reg. 1: | 0 | 1 | 0 | 0 | 0 | 1 | 1 | 1 | 0 | 1 | 0 | 1 | 1 | 0 |
| Reg. 2: | 0 | 0 | 0 | 0 | 0 | 1 | 1 | 0 | 1 | 1 | 1 | 0 | 1 | 0 | 1 |
| Reg. 3: | 0 | 1 | 0 | 0 | 0 | 0 | 0 | 1 | 0 | 1 | 0 | 0 | 0 | 1 | 1 |

Result: w=5;

...

METHOD AND DECODER FOR DETERMINING AN ERROR VECTOR FOR A DATA WORD ACCORDING TO A REED-MULLER CODE

CROSS-REFERENCE TO RELATED APPLICATION

This application claims priority to German Patent Application Serial No. 10 2015 111 729.0, which was filed Jul. 20, 2015, and is incorporated herein by reference in its entirety.

TECHNICAL FIELD

Various embodiments relate generally to methods and decoders for determining an error vector for a data word according to a Reed-Muller Code.

BACKGROUND

For allowing correction of errors in data which were caused in a data transmission or storage or reading the data to and from a memory, data are typically encoded by a code. Such a code can for example also be used to reconstruct a value provided by a PUF (Physical Uncloneable Function). In both cases it is required that an error vector in a data word (e.g. a data word received in a message or a PUF value) is determined. It is desirable that such a determination can be carried out efficiently.

SUMMARY

A method for determining an error vector for a data word according to a Reed-Muller Code includes determining the syndrome of the error vector according to the Reed-Muller Code, expanding the syndrome with zeroes to 1 bit length less than the length of the Reed-Muller Code, determining a code word of a Simplex Code of 1 bit length less than the length of the Reed-Muller Code whose difference to the expanded syndrome has a weight below a first threshold or equal to or above a second threshold, expanding the difference between the determined code word and the expanded syndrome by a zero, and outputting the expanded difference as error vector if its weight is below the first threshold or outputting the inverted expanded difference as error vector if the weight of the expanded difference is equal to or above the second threshold.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 14 gives another example of a decoding for the (16, 32, 8) Reed-Muller code;
FIGS. 15A to 15C give an example of a super decoding for the Reed-Muller code $R_4$ by the decoder;
FIGS. 16A to 16C give another example of a super decoding for the Reed-Muller code $R_4$ by the decoder;
FIG. 17 gives a further example of a super decoding for the Reed-Muller code $R_4$ by the decoder.

DESCRIPTION

Figure 1:
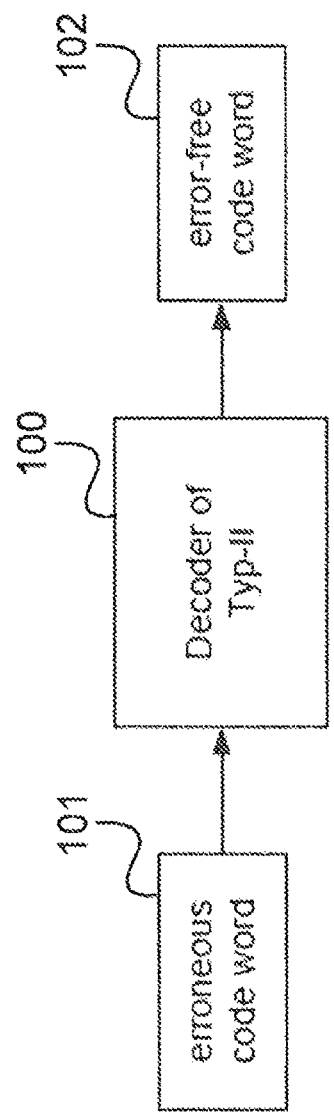
FIG. 1 shows a Type-II decoder.

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

According to one embodiment, a method for determining an error vector for a data word according to a Reed-Muller Code is provided including determining the syndrome of the error vector according to the Reed-Muller Code; expanding the syndrome with zeroes to 1 bit length less than the length of the Reed-Muller Code, determining a code word of a Simplex Code of 1 bit length less than the length of the Reed-Muller Code whose difference to the expanded syndrome has a weight below a first threshold or equal to or above a second threshold, expanding the difference between the determined code word and the expanded syndrome by a zero, and outputting the expanded difference as error vector if its weight is below the first threshold or outputting the inverted expanded difference as error vector if the weight of the expanded difference is equal to or above the second threshold.

According to a further embodiment, a decoder for determining an error vector for a data word according to a Reed-Muller Code according to the above method is provided.

For each integer $m \geq 1$ there is a binary linear $(2^m, 2^{m+1}, 2^{m-1})$ code, called the first-order Reed-Muller (RM) code. Each code word c of the code has length $n=2^m$. The Reed-Muller code has a total of $2^{m+1}$ different code words. The minimum distance of the code is $d=2^{m-1}$. This means that any two distinct code words of the code differ in at least $2^{m-1}$ coordinate positions, that is in at least 50% of the $n=2^m$ positions. This is written as $d(c_1; c_2) \geq 2^{m-1}$ for code words $c_1$ and $c_2$ with $c_1 \neq c_2$.

The all-zero vector $(0, 0, \ldots, 0)$ and the all-one vector $(1, 1, \ldots, 1)$ are code words which differ in all $n=2^m$ positions. This is the only exception to the rule that all (other) pairs of distinct code words of the Reed-Muller Code differ in exactly $n/2=2^{m-1}$ positions.

Due to its large minimum distance, the first-order Reed-Muller code can correct a relatively high number of errors. Moreover, there is a simple and fast decoding algorithm (i.e. error correcting algorithm) available for the RM code.

The $(2^m, 2^{m+1}, 2^{m-1})$ RM code is a binary linear code $C_m$ of length $n=2^m$. That is, the set of code words of the code $C_m$ is a linear subspace of the vector space $V=F_2^n$, i.e. the vector space that consists of all binary row vectors of length n. Since there are $2^{m+1}$ code words (the elements of $C_m$) the subspace $C_m$ has the dimension $k=m+1$. For this reason, the RM code $R_m$ is also denoted as a $(2^m, m+1, 2^{m-1})$ linear code.

The RM code encoding creates for any given $k=m+1$ message bits a code word of length $n=2^m$. Thus (unless m is very small), the produced code word is typically much longer that the given message word allowing the code word to store a lot of redundant information. The high redundancy in the code words enables the RM code to correct many errors.

For example, let $m=3$. The corresponding RM code $C_3$ is a linear (8, 16, 4) code. That is, a code of length $n=8$, dimension $k=4$, and minimum distance $d=4$.

The generator matrix of the RM code $C_3$ is given by $$G = \begin{pmatrix} 1 & 1 & 1 & 1 & 1 & 1 & 1 & 1 \\ 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \end{pmatrix}.$$

The encoding rule transforms the message $a=(a_0, a_1, a_2, a_3)$ of length $k=4$ into the code word $b=(b_0, b_1, b_2, b_3, b_4, b_5, b_6, b_7)$ of length $n=8$. The encoding rule is given by $b=aG$.

Carrying out the multiplication of the vector a with the matrix G gives $b_0 = a_0$ $b_1 = a_0 + a_3$ $b_2 = a_0 + a_2$ $b_3 = a_0 + a_2 + a_3$ $b_4 = a_0 + a_1$ $b_5 = a_0 + a_1 + a_3$ $b_6 = a_0 + a_1 + a_2$ $b_7 = a_0 + a_1 + a_2 + a_3$.

Adding together the equations for $b_0$ and $b_4$ gives $a_1 = b_0 + b_4.$

Adding the equations for b1 and b5 gives $a_1 = b_1 + b_5.$

Similarly, combining the equations for $b_2$ and $b_6$ yields $a_1 = b_2 + b_6.$ Combining the equations for $b_3$ and $b_7$ gives $a_1 = b_3 + b_7.$ Thus, the message bit $a_1$ can be expressed in four different independent ways using the code word bits $b_j$:

$a_1 = b_0 + b_4$ $a_1 = b_1 + b_5$ $a_1 = b_2 + b_6$ $a_1 = b_3 + b_7.$

This demonstrates that the message bit $a_1$ is contained in the code word $b=(b_0, b_1, b_2, b_3, b_4, b_5, b_6, b_7)$ in a highly redundant way. The message bit $a_1$ can be computed from the code word b in four different ways. The same holds true for the other message bits $a_0$, $a_2$, and $a_3$.

A decoding algorithm may make use of this fact: assuming that the original word $b=(b_0, b_1, b_2, b_3, b_4, b_5, b_6, b_7)$ becomes erroneous during transmission or storage and the received word is $b'=(b_0', b_1', b_2', b_3', b_4', b_5', b_6', b_7')$ and further assuming that one bit of b' is erroneous, to determine the true message bit $a_1$, one may compute $b_0'+b_4', b_1'+b_5', b_2'+b_6', b_3'+b_7'$ and do a majority voting on these four values. For instance, if three of these values are 0 and one value equals 1, $a_1$ may be set to 0.

The message bits $a_0$, $a_2$, $a_3$ may be retrieved from b' in a similar way. Once the message word $a=(a_0, a_1, a_2, a_3)$ has been determined in this way, the equation $aG=b$ may be used to produce the entire code word if needed. (In some applications one is only interested in the message bits $a_0$, $a_1$, $a_2$, $a_3$, and does not care for the entire code word. In this case one is satisfied if the task of having corrected the four message bits has been completed.)

The above decoding algorithm is called majority logic decoding algorithm and has been proposed by I. S. Reed in 1954.

There are different mathematical approaches to the Reed-Muller code. The approach of Reed uses Boolean functions. That is, the code words are regarded as Boolean functions. Another approach to the RM code uses Hadamard matrices and a theorem on their factorization. This approach was used by R. R. Green in 1966 and led to the development of another efficient decoder for the RM code called the Green machine.

Since the (first-order) RM code $C_m$ has minimum distance of $d=2^{m-1}$, the decoder can correct up to $t=\frac{1}{2}d-1=2^{m-2}-1$ errors. In the above example $m=3$ and $d=4$ implying that one bit of the code word of length $n=8$ can be corrected.

For $m=5$, the RM code $C_5$ has length $2^5=32$ and minimum distance $d=2^4=16$. Thus any seven (or fewer) bits of the code word of length $n=32$ can be corrected. In fact, the code $C_5$ was used by NASA in 1972 to encode photographs sent from Mars by Marine 9.

For a linear (n, $2^k$, d) code, two types of decoding algorithms may be distinguished.

The first type acts directly on the received potentially corrupted code word b' and produces the corrected code word b. This is illustrated in FIG. 1.

FIG. 1 shows a Type-II decoder 100.

The Type-II decoder 100 receives a data word 101 corresponding to an erroneous code word 102 and generates an error-free code word, assuming that the number of erroneous bits is not too high.

The second type of decoder, called Type-I decoder, first computes from the received data word b' of length n (which is a potentially corrupted code word) a vector of length n−k called the syndrome of b' and written as s=S(b'). Next the syndrome s is input to the decoder which outputs the error vector e of length n. Finally, the corrected code word b is computed by b=b'+e. This is illustrated in FIG. 2.

Figure 2:
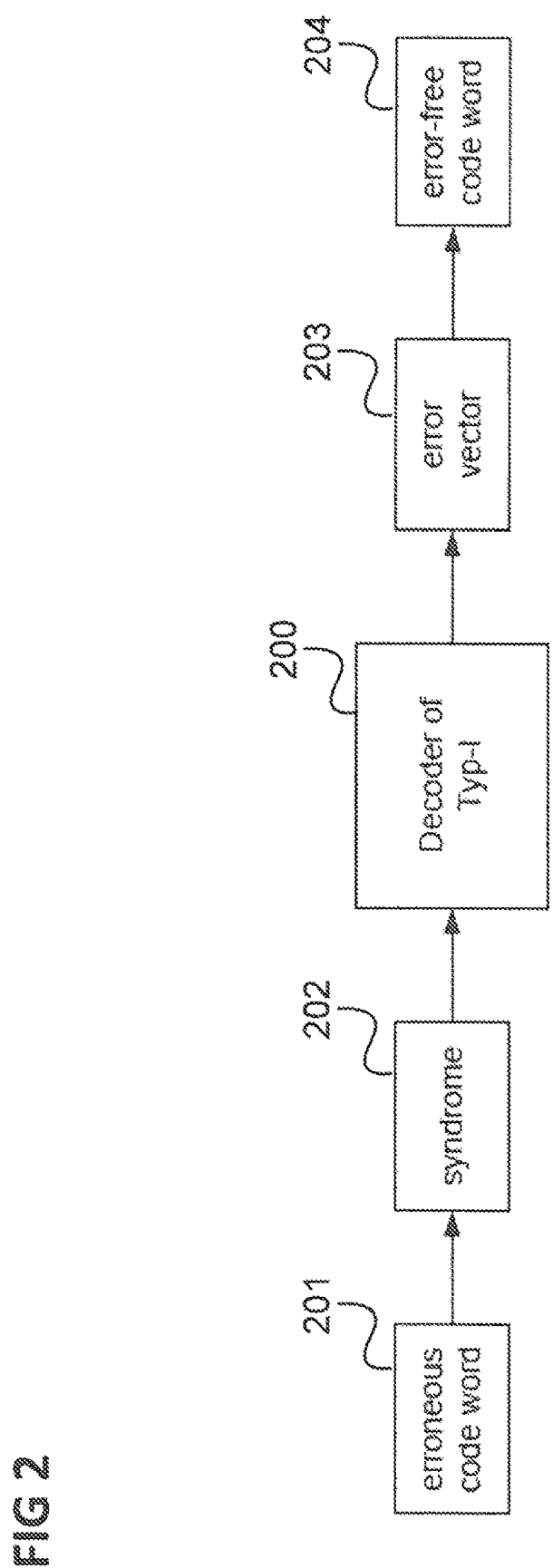
FIG. 2 shows a Type-I decoder.

FIG. 2 shows a Type-I decoder 200.

The Type-I decoder 200 receives a syndrome 202 generated from a received data word 201 and (assuming that the number of erroneous bits in the received data word 201 is not too high) generates an error vector 203 based on which the errors can be corrected, i.e. the error-free code word 204 can be reconstructed.

Both the majority logic decoder of I.S. Reed and the serial orthogonal decoder of R.R. Green are Type-II decoders. However, Type-I decoders are typically superior over Type-II decoders. In various embodiments, this is true in the context of reconstructing PUF (Physical Uncloneable Function) values and biometric data which is typically accomplished by deploying methods from algebraic coding theory as described in the following.

In PUF systems a bit string A is associated with a physical object. Similarly, in biometry a bit string A is associated with a person. (The bit string A could, e.g., be the digitized fingerprint of the person, or a digitized scan of the iris of the person's eye.) The bit string A is uniquely defined. (For example, A is the result of measurements during an enrollment process.)

To allow reconstruction of A, in the framework of algebraic coding theory, helper information (or auxiliary information) h is computed from A. The helper information h contains some, but not all, information of the bit string A. Therefore, it is impossible to reconstruct A from h alone. As a consequence, the helper information h can be made public, whereas A is treated as a secret.

Let at a later point in time a new PUF value A' be produced from the physical object or a new biometric value (e.g. fingerprint, iris scan, or some other biometric data) be produced from the person. The public helper information h along with the actual bit string A' allows reconstructing the original bit string A.

There are two approaches to achieve this with a code C:

1. Using Type-II decoder:

Enrollment:

Given: biometric value or PUF value A

Compute helper data: $h=A+c_{rand}$ with $c_{rand} \in C$, chosen at random.

Authentication:

Given: actual biometric value or PUF value A'

1. Compute $A'+h=A'+(A+c_{rand})=(A'+A)+c_{rand}=e+c_{rand}$.

2. Input=$e+c_{rand}$ to the Type-II decoder, which outputs $c_{rand}$ (assuming not to many differences exist between A and A' for the code to handle)

3. Compute A via $A=h+c_{rand}$.

2. Using Type-I decoder:

Enrollment:

Given: biometric value or PUF value A.

Compute helper data: h=S(A), the syndrome of A.

Authentication:

Given: actual biometric value or PUF value A'.

1. Compute S(A'), the syndrome of A'.

2. Compute S(A')+h=S(A')+S(A)=S(A+A')=S(e).

3. Input S(e) to the Type-I decoder, which outputs e (assuming not too many differences exist between A and A' for the code to handle).

4. Compute A via A=A'+e.

As can be seen, for the usage of the Type-I decoder, a random number generator is required, which is not the case for the usage of the Type-II decoder. Further, the helper information for the Type-II decoder includes only n−k bit while for the Type-I decoder it includes n bit.

As described in further detail below, the first-order Reed-Muller code can be derived from the simplex code $S_m$. The simplex code $S_m$ of order m is a linear $(2^m-1, 2^m, 2^{m-1})$ code. This means that the code words have length $n=2^m-1$, the code $S_m$ contains a total of $2^m$ code words (so that the code has dimension m), and the code has minimum distance $d=2^{m-1}$.

The simplex code $S_m$ can be constructed via a primitive binary polynomial f(x) of degree m. The polynomial f(x) defines a linear recursion of order m. If $$f(x)=x^m+b_{m-1}x^{m-1}+\ldots+b_1x+b_0$$

then the associated linear recursion is given by $$u_{j+m}=b_{m-1}u_{j+m-1}+\ldots+b_1u_{j+1}+b_0u_j \text{ for } j=0,1,\ldots$$

One may choose m binary initial values $u_0, u_1, u_{m-1}$ arbitrarily, and then use the linear recursion to produce the terms $u_m, u_{m+1}, \ldots$. In this manner, an infinite sequence is defined which is periodic with a length of the period of $2^m-1$. A full portion of the period of the sequence, i.e., $(u_0, u_1, \ldots, u_{2^m-2})$ is a code word of the simplex code $S_m$ according to this construction approach. Since the m binary initial values $u_0, u_1, \ldots, u_{m-1}$ may be chosen in $2^m$ different ways this approach gives $2^m$ different sequences and thus $2^m$ different code words.

For example, to construct the simplex code $S_3$ of order 3 the primitive polynomial $f(x)=x^3+x+1$ may be used. The associated linear recursion is given by $$u_{j+3}=u_{j+1}+u_j \text{ for } j=0,1,\ldots.$$

If the three arbitrary binary numbers for the initial values $u_0, u_1, u_2$ are chosen then the remaining terms of the sequence $\{u_i\}$ are uniquely determined. For instance, the initial values $u_0=1, u_1=1, u_2=1$ define the infinite sequence 1 1 1 0 0 1 0, 1 1 1 0 0 1 0, 1 1 ....

The vector c containing the first seven terms of the sequence, namely the vector $$c=(1\ 1\ 1\ 0\ 0\ 1\ 0)$$

represents a code word of the simplex code $S_3$. There are eight possibilities to choose the three initial values $u_0, u_1, u_2$, which correspond to the eight code words of $S_3$. The code words are $$c_0=0\ 0\ 0\ 0\ 0\ 0\ 0,$$

$$c_1=0\ 0\ 1\ 0\ 1\ 1\ 1,$$

$$c_2=0\ 1\ 0\ 1\ 1\ 1\ 0,$$

$$c_3=0\ 1\ 1\ 1\ 0\ 0\ 1,$$

$$c_4=1\ 0\ 0\ 1\ 0\ 1\ 1,$$

$c_5$=1 0 1 1 1 0 0, $c_6$=1 1 0 0 1 0 1, $c_7$=1 1 1 0 0 1 0.

Thus, the simplex code of order 3 consists of 8 code words. The simplex code of order m=3 is a $(2^3-1, 2^3, 2^{3-1})=(7, 8, 4)$ code. The code words have length n=7, there are 8 code words, and the minimum distance of the code equals 4. This is reflected by the fact that each nonzero code word has weight 4, which means that each such code word contains four ones.

Figure 3:
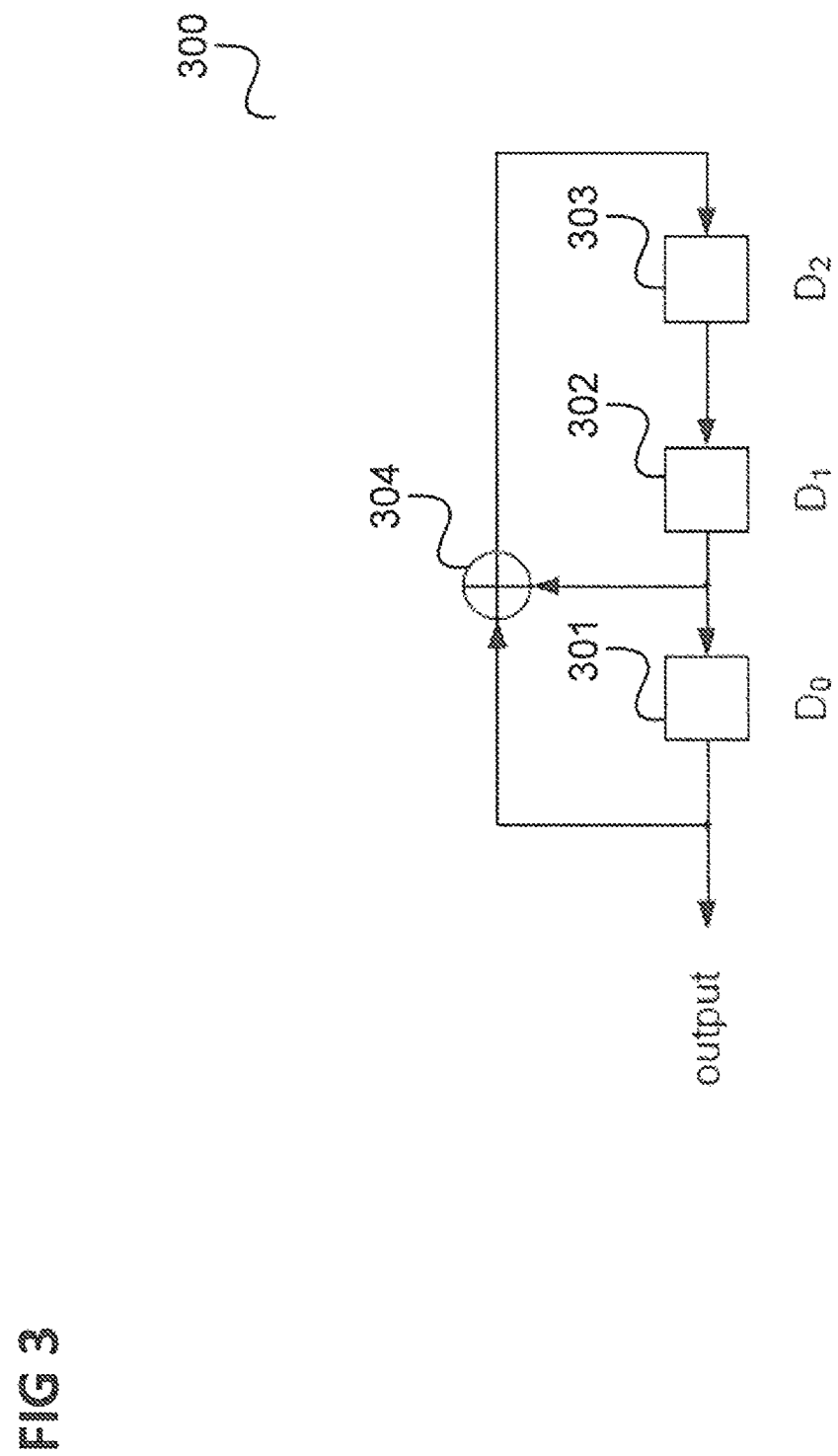
FIG. 3 shows a linear feedback shift register (LFSR)

A linear recursion can be implemented as a linear feedback shift register (LFSR). For instance, the linear recursion $$u_{j+3}=u_{j+1}+u_j \text{ for } j=0,1,\ldots$$

corresponds to the LFSR depicted in FIG. 3.

FIG. 3 shows a LFSR 300.

The LFSR 300 includes three flip-flops 301, 302, 303 which are connected to a shift register (shifting from right to left in FIG. 3). The output of the first flip-flop 301 and the output of the second flip-flop 302 are fed back to the input of the third flip-flop 303 via an XOR 304. The output of the first flip-flop 301 is the output of the LSFR 300.

For example, if the LFSR is initialized with $u_0$=1, $u_1$=1, $u_2$=1 (from left to right in FIG. 3) and it is clocked $7=2^3-1$ times, it outputs the code word c=1 1 1 0 0 1 0.

According to one embodiment, the fact is used that the (first-order) Reed-Muller code can be derived from the simplex code $S_m$ in the following manner:
  Extend each code word of $S_m$ by introducing an additional zero at the front of each code word. This gives a set $A_m$ of $2^m$ vectors of length $2^m$.
  Next, compute for each vector in $A_m$ the binary complement vector. This yields a further set $B_m$ of $2^m$ binary vectors of length $2^m$.
  The union $A_m \cup B_m$ contains $2 \cdot 2^m = 2^{m+1}$ binary vectors of length $2^m$.
  The set $A_m \cup B_m$ is again a linear code. The new code has length $n=2^m$, dimension k=m+1, and minimum distance $d=2^{m-1}$. In other words, $A_m \cup B_m$ constitutes a linear $(2^m, 2^{m+1}, 2^{m-1})$ code which is in fact equivalent to the Reed-Muller code and is denoted by $R_m$ in the following. (Two codes are said to be equivalent if the code words of one code can be obtained from the code words of the other by consistently rearranging code word entries.)

As it is customary to refer to equivalent codes as being identical codes, one can write $C_m = R_m = A_m \cup B_m$.

However, equivalent codes, although having the same parameters (code length, dimension, minimum distance) may differ in certain structural properties, which is the case for the original Reed-Muller code $C_m$ and the Reed-Muller code $R_m$ derived from the simplex code. In fact, according to various embodiments as described further below such additional structural properties can be seen to be exploited.

As an example, consider the simplex code $S_4$ defined by the primitive polynomial $f(x)=x^4+x^3+1$.

The associated linear recursion reads $u_j+4=u_{j+3}+u_j$ for j=0, 1, ...

The 15-bit vector
  c=0 1 1 1 1 0 1 0 1 1 0 0 1 0 0
is a code word of the simplex code $S_4$. The code word c may be used to create two 16-bit code words of the Reed-Muller code $R_4$, namely
  a=(0; c)=0 0 1 1 1 1 0 1 0 1 1 0 0 1 0 0;
  b=(1; $\bar{c}$)=1100001010011011.

Using this method on all 16 code words of $S_4$, the 32 code words of $R_4$ can be obtained.

Similarly, the code words of $S_3$ as given above, namely,
  $c_0$=0 0 0 0 0 0 0,
  $c_1$=0 0 1 0 1 1 1,
  $c_2$=0 1 0 1 1 1 0,
  $c_3$=0 1 1 1 0 0 1,
  $c_4$=1 0 0 1 0 1 1,
  $c_5$=1 0 1 1 1 0 0,
  $c_6$=1 1 0 0 1 0 1,
  $c_7$=1 1 1 0 0 1 0
give rise to the code words
  $(0;c_0),(1;\bar{c}_0),(0;c_1),(1;\bar{c}_1),(0;c_2),(1;\bar{c}_2)$ $(0;c_3),(1;\bar{c}_3)$ $(0;c_4),(1;\bar{c}_4)$ $(0;c_5), (1;\bar{c}_5)$ $(0; c_6),(1;\bar{c}_6)$ $(0; c_7),(1; \bar{c}_7)$ of the (16, 32, 8) Reed-Muller code $R_4$ (the bar over a binary vector denotes bitwise binary complementation).

The simplex code $S_m$ and the Reed-Muller code $R_m$ can thus be seen to be related according to $R_m=(0, S_m)\cup(1, \bar{S}_m)$.

The original Reed-Muller code $C_m$ lacks at least two properties that the equivalent code $R_m$ derived from the simplex code $S_m$ possesses. For the original Reed-Muller code, the encoding function has the form $$\text{Enc: } a_0 a_1 \ldots a_m \mapsto b_0 b_1 \ldots b_{n-1}$$

where $n=2^m$. In contrast, the encoding function of the equivalent code $R_m$ is of the form $$\text{Enc: } a_0 a_1 \ldots a_m \mapsto a_0 a_1 \ldots a_m r_{m+1} r_{m+2} \ldots r_{n-1}.$$

This means that the m+1 information bits $a_0, a_1, \ldots, a_m$ reappear as the first m+1 code word bits followed by the redundancy bits $r_{m+1}, \ldots, r_{n-1}$. A code whose encoding function has this form is called a systematic code. Thus, $R_m$ is a systematic code.

As for the second property, a code C of length n is called cyclic if $$(c_0,c_1,\ldots,c_{n-1})\in C \text{ implies} (c_1,c_2,\ldots,c_{n-1},c_0)\in C.$$

While the simplex code is cyclic the Reed-Muller code is not cyclic. However, the equivalent version of the Reed-Muller code, the code $R_m$, comes close to being cyclic:

$$(c_0,c_1,c_2,\ldots,c_{n-1})\in R_m \text{ implies} (c_0,c_2,c_3,\ldots,c_{n-1}, c_1)\in R_m.$$

The fact that the equivalent version of the Reed-Muller code $R_m$ is strongly related to the simplex code $S_m$ together with the fact that the simplex code can easily be implemented on linear feedback shift registers (LFSRs), allows to construct efficient switching circuits for encoding, decoding, and syndrome computing for the code $R_m$.

For example, the primitive polynomial $f(x)=x^4+x^3+1$ may be used to create the (16, 32, 8) Reed-Muller code $R_4$. The code has dimension k=5. Therefore, five information bits $a_0$, $a_1$, $a_2$, $a_3$, $a_4$ are encoded into a code word of length n=16. In other words, to the given five information bits $a_0$, $a_1$, $a_2$, $a_3$, $a_4$, eleven control bits (also called check bits or redundancy bits) $r_5$, $r_6$, ..., $r_{15}$, have to be computed for encoding so that the vector
  $(a_0, a_1, a_2, a_3, a_4, r_5, r_6, r_7, r_8, r_9, r_{10}, r_{12}, r_{13}, r_{14}, r_{15})$
is a code word of R4. The task can be accomplished using the circuit illustrated in FIG. 4.

Figure 4:
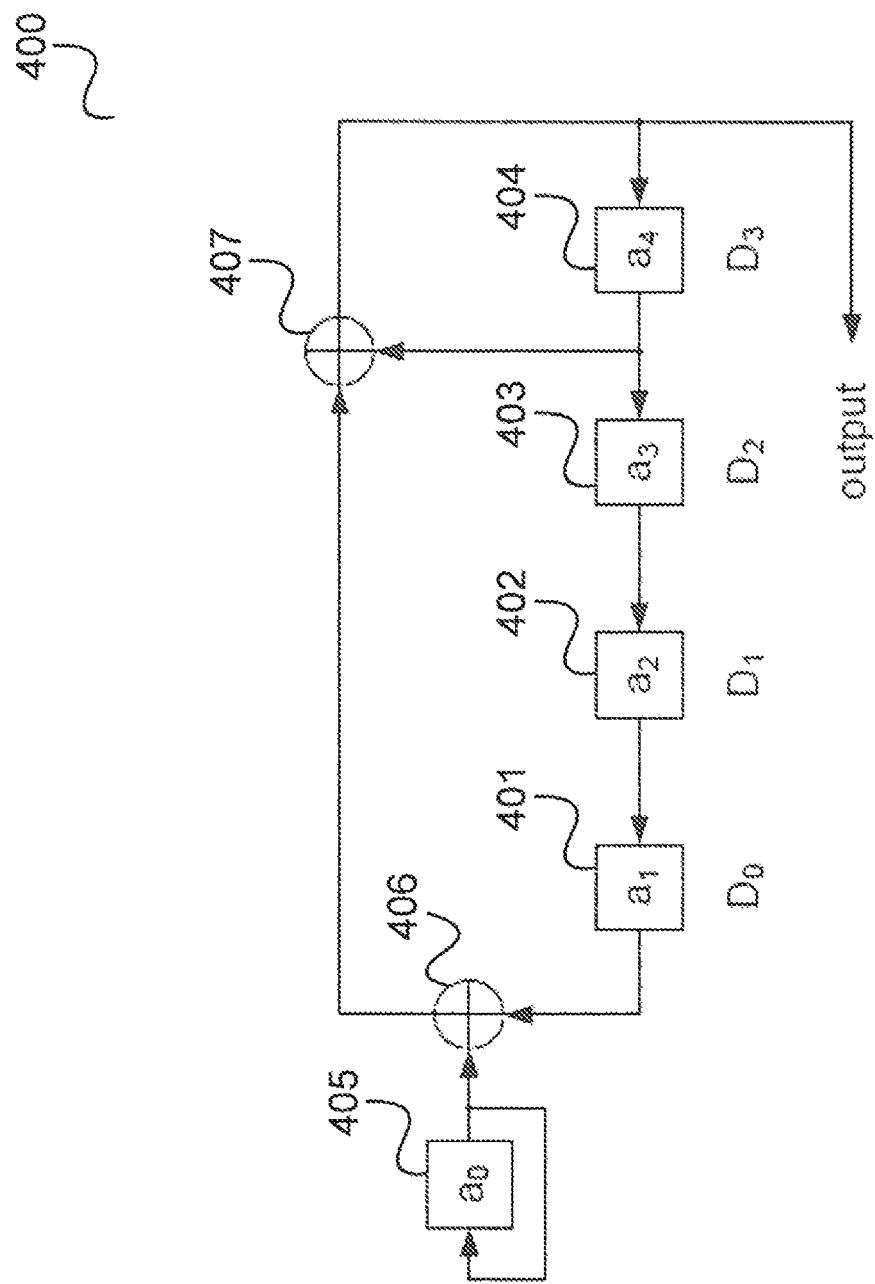
FIG. 4 shows an encoder for the Reed-Muller code $R_4$.

FIG. 4 shows an encoder 400 for the Reed-Muller code $R_4$.

The encoder 400 includes four flip-flops 401, 402, 403, 404 which are connected to a shift register (shifting from right to left in FIG. 4). The output of the first flip-flop 401 and the output of the fourth flip-flop 404 as well as the output of a fifth flip-flop 405 (whose value is fed back into itself)

are fed back to the input of the fourth flip-flop 404 via two XORs 406, 407. This feedback is also the output of the LSFR 400.

Initializing the shift register (from left to right) with $a_1$, $a_2$, $a_3$, $a_4$ and the fifth flip-flop 405 with $a_0$ and clocking the encoder 400 11 times (i.e. operating it for 11 clock cycles), the output is ($r_5$, $r_6$, $r_7$, $r_8$, $r_9$, $r_{10}$, $r_{11}$, $r_{12}$, $r_{13}$, $r_{14}$, $r_{15}$).

The generated eleven output bits are the desired eleven control bits for the information bits $a_0$, $a_1$, $a_2$, $a_3$, $a_4$.

As example, for the information bits 11000, the encoder 400 generates the control bits 01010011011.

Figure 5:
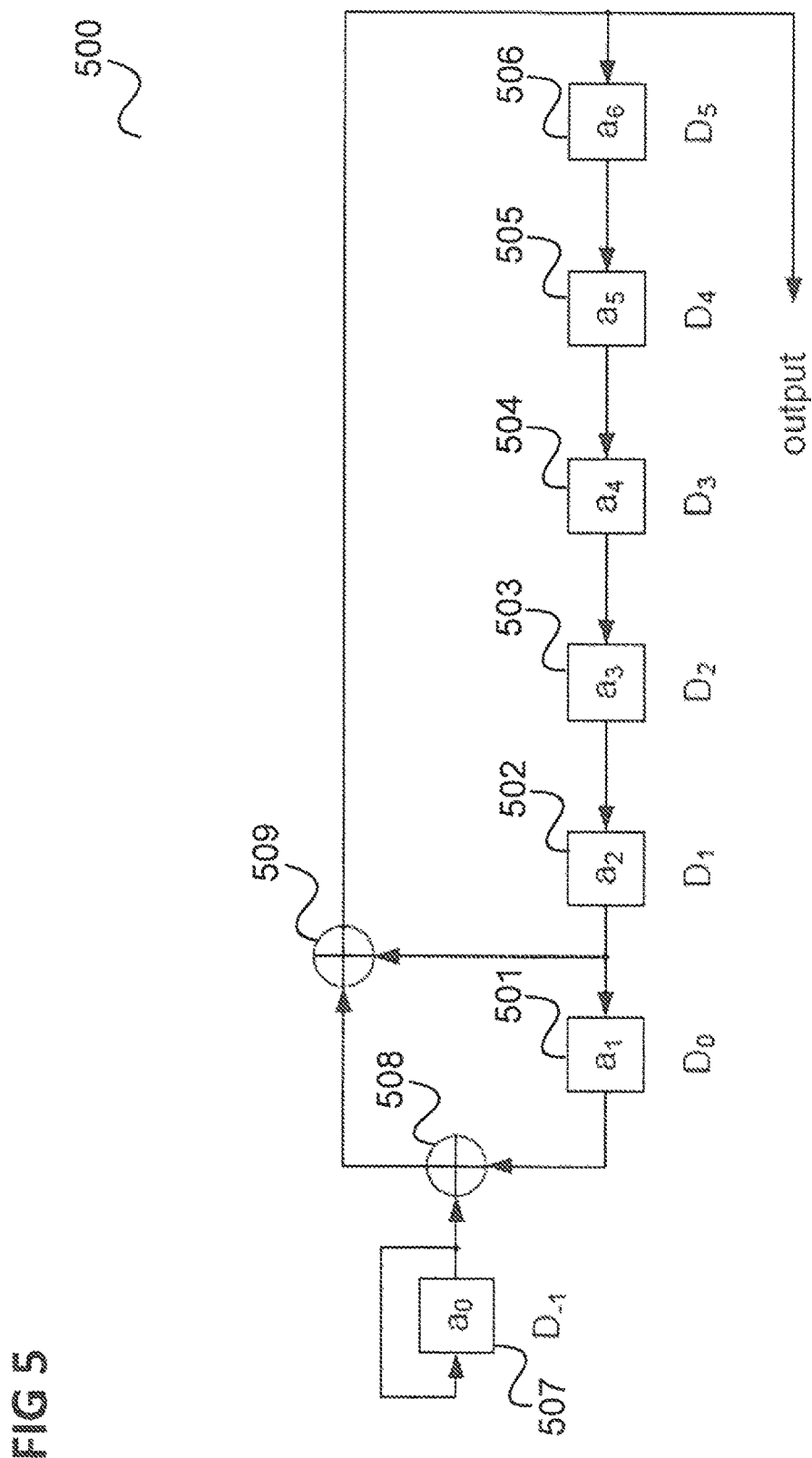
FIG. 5 shows an encoder for the Reed-Muller code $R_6$.

An encoder for the (64, 128, 32) Reed-Muller code $R_6$ defined by the primitive polynomial $f(x)=x^6+x+1$ can be implemented by the circuit illustrated in FIG. 5.

FIG. 5 shows an encoder 500 for the Reed-Muller code $R_6$.

The encoder 500 includes six flip-flops 501, 502, 503, 504, 505, 506 which are connected to a shift register (shifting from right to left in FIG. 4). The output of the first flip-flop 501 and the output of the second flip-flop 502 as well as the output of a seventh flip-flop 507 (whose value is fed back into itself) are fed back to the input of the sixth flip-flop 506 via two XORs 508, 509. This feedback is also the output of the LSFR 500.

The code $R_6$ has a dimension of 7. Therefore, seven information bits $a_0$, $a_1$, ..., $a_6$ give rise to a 64 bit long code word $a_0 a_1 \ldots a_6 r_7 r_8 \ldots r_{63}$. If the shift register of the circuit 500 is initialized with the bits $a_1, \ldots, a_6$, and the seventh flip-flop is initialized with $a_0$ and the encoder 500 is clocked 57 times, the 57 control bits of the code word are output.

Figure 6:
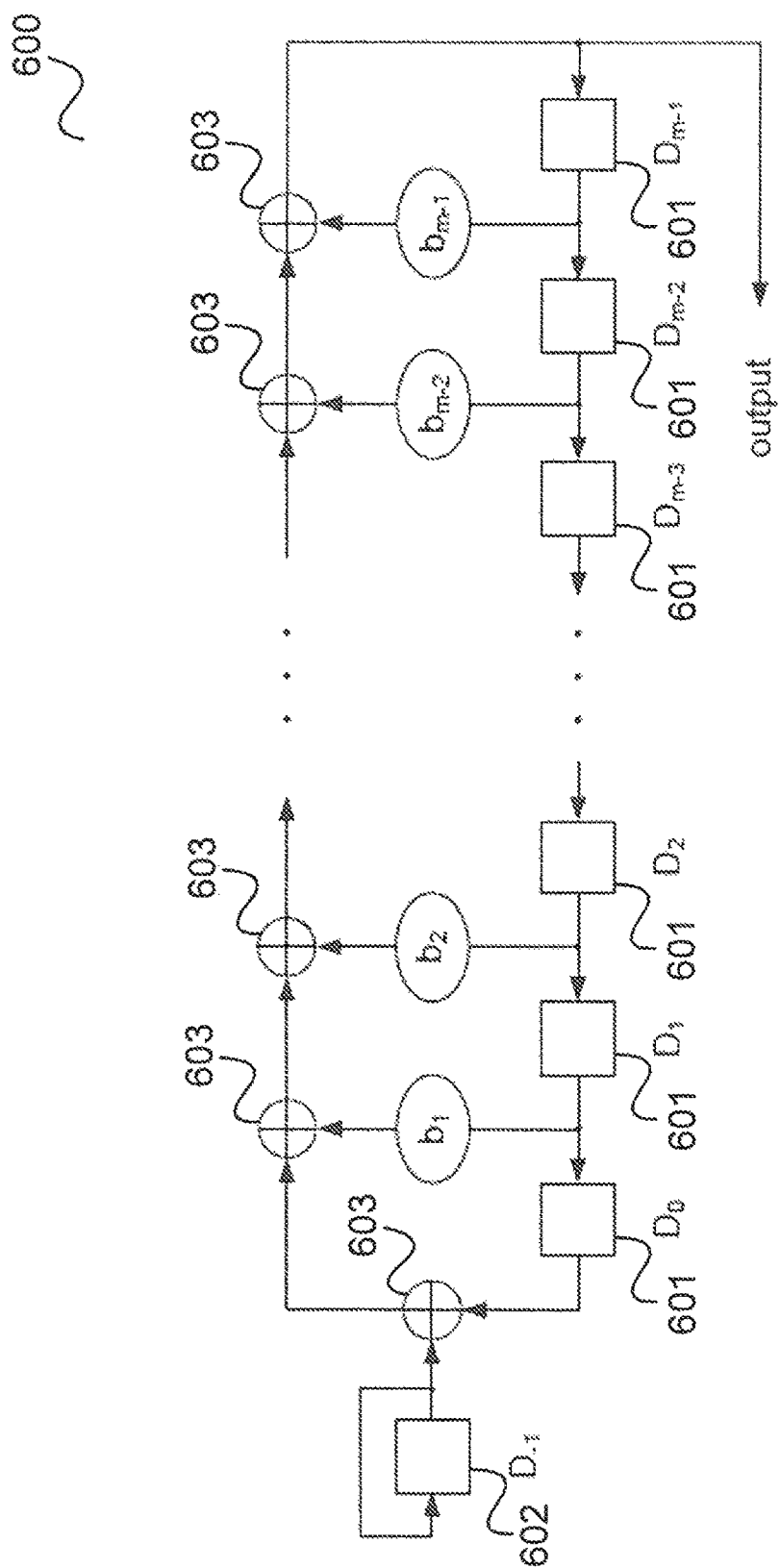
FIG. 6 shows an encoder for the Reed-Muller code $R_m$.

In general, for the ($2^m$, $2^{m+1}$, $2^{m-1}$) Reed-Muller code $R_m$ specified by the binary primitive polynomial $$f(x)=x^m+b_{m-1}x^{m-1}+\ldots+b_1x+1$$

an encoder may be implemented by a switching circuit as illustrated in FIG. 6.

FIG. 6 shows an encoder 600 for the Reed-Muller code $R_m$.

The encoder 600 includes m flip-flops 601 which are connected to a shift register (shifting from right to left in FIG. 6). The output of the first flip-flop and, if $b_i=1$, the output of the ith flip-flop (for i=1, ..., m−1), as well as the output of an m+1th flip-flop 602 (whose value is fed back into itself) are fed back to the input of the mth flip-flop via XORs 603. This feedback is also the output of the LSFR 600.

The flip-flops (in general memory cells) of the shift register are initialized with the information bits $a_1$, $a_2$, ..., $a_m$, and the m+1th flip-flop with $a_0$, respectively. The circuit 600 is clocked $2^m-m-1$ times to produce the redundancy bits $r_{m+1}$, $r_{m+2}$, ..., $r_{n-1}$, where $n=2^m$ is the code word length.

In the following, a syndrome computer (i.e. a syndrome computing approach and computing circuit) for the code $R_m$ is described.

Every binary linear (n, $2^k$, d) code C can be described by a binary (n−k)×n matrix H of rank n−k, called the parity check matrix of the code C. The code C can be seen as the null space of the parity check matrix H. In other words, a binary vector c of length n is a code word if and only if $Hc^t=0$.

If y is any binary vector of length n, then the vector $$S(y)=Hy^t$$

of length n−k is called the syndrome of y. Thus, the aforementioned property of H can be reformulated as: a binary vector of length n is a code word if and only if it has zero syndrome. The importance of the concept lies in the fact that data words corresponding to erroneous code words that exhibit identical error patterns have identical syndromes.

Figure 7:
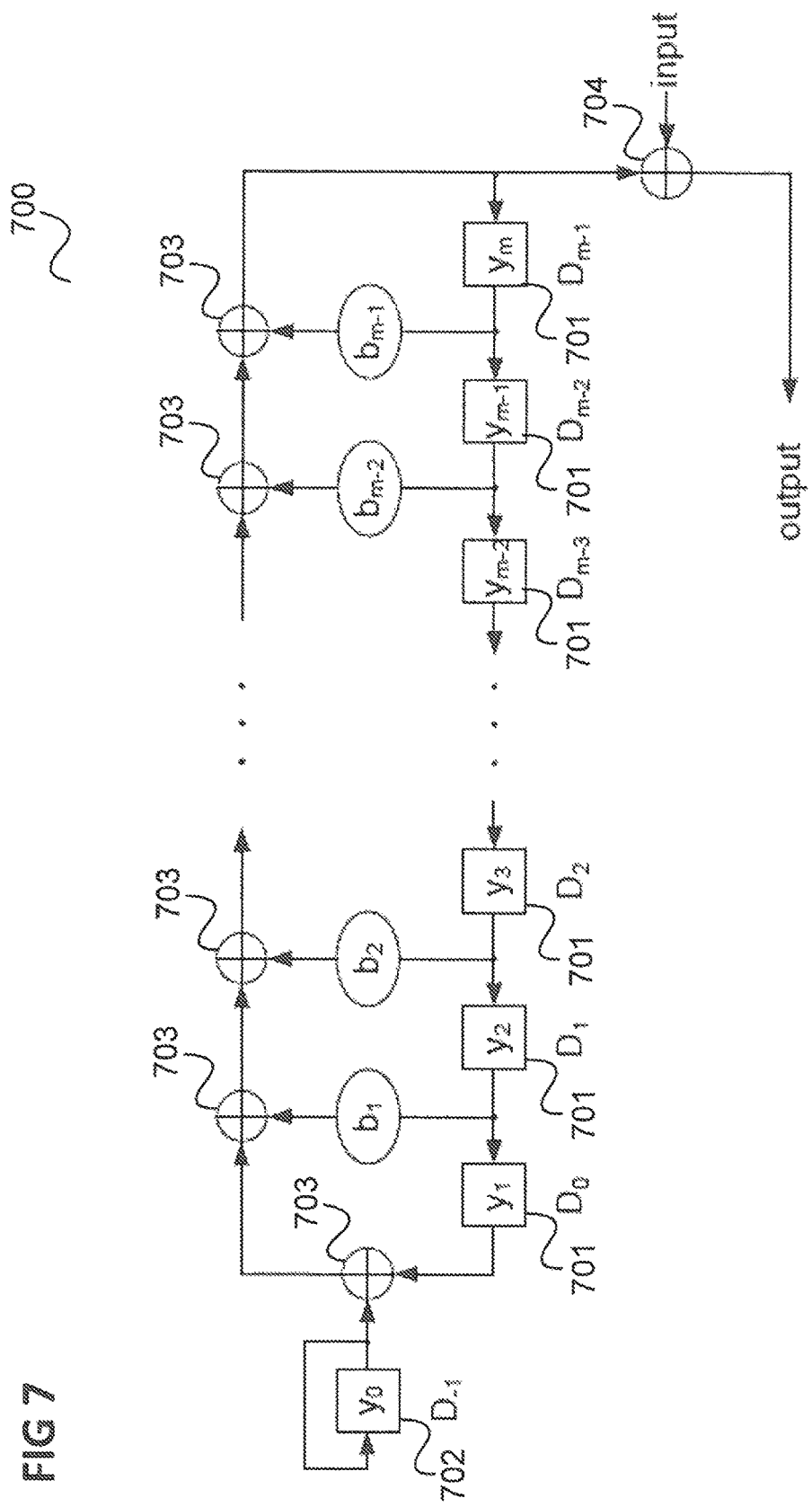
FIG. 7 shows a syndrome generator for the Reed-Muller code $R_m$.

While in general the syndrome of y has to be computed by carrying out the matrix multiplication $Hy^t$, in the case of the Reed-Muller code $R_m$ (derived from the simplex code $S_m$) a more efficient way may be used, as illustrated in FIG. 7.

FIG. 7 shows a syndrome generator 700 for the Reed-Muller code $R_m$.

Let the ($2^m$, $2^{m+1}$, $2^{m-1}$) Reed-Muller code $R_m$ be defined by the primitive binary polynomial $$f(x)=x^m+b_{m-1}x^{m-1}+\ldots+b_1x+1.$$

The syndrome generator 700 may be seen to be similar to the encoder switching circuit 600. Similarly to the encoder 600, the syndrome generator 700 includes m flip-flops 701 which are connected to a shift register (shifting from right to left in FIG. 7). The output of the first flip-flop and, if $b_i=1$, the output of the ith flip-flop (for i=1, ..., m−1), as well as the output of an m+1th flip-flop 702 (whose value is fed back into itself) are fed back to the input of the mth flip-flop via XORs 703. This feedback is combined with the input of the syndrome generator 700 by a further XOR 704 whose output is the output of the syndrome generator 700.

It is assumed that the syndrome S(y) is to be calculated for a binary vector $y=(y_0, y_1, \ldots, y_{n-1})$ of length $n=2^m$. The syndrome generator 700 outputs the syndrome S(y) when $(y_{m+1}, y_{m+2}, \ldots, y_{n-1})$ is input (one bit per clock cycle), the shift register is initialized (from left to right) with the elements $y_1, y_2, \ldots, y_m$ and the m+1th flip-flop with $y_0$, respectively, and clocked $n-k=2^m-m-1$ times.

Figure 8:
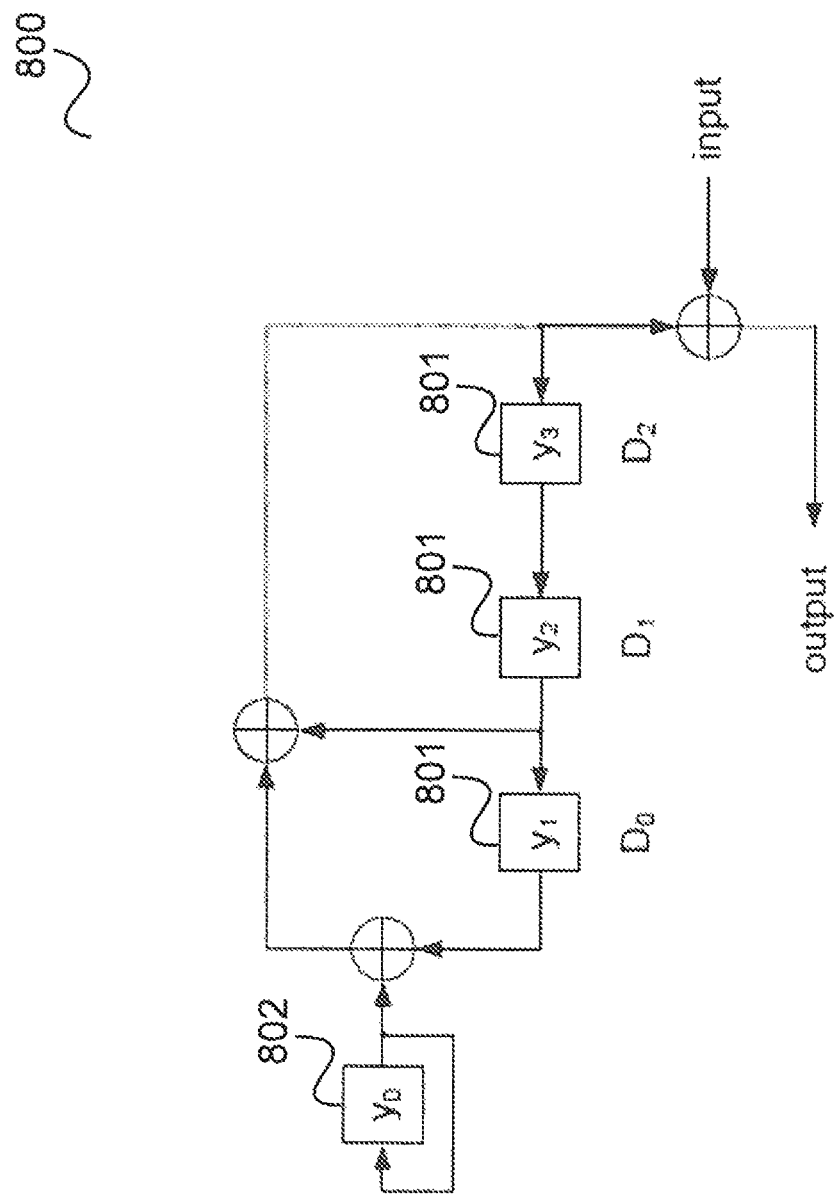
FIG. 8 shows an example of the syndrome generator of FIG. 7 for the (8, 16, 4) Reed-Muller code $R_3$.

FIG. 8 shows an example of the syndrome generator of FIG. 7 for the (8, 16, 4) Reed-Muller code $R_3$ defined by $f(x)=x^3+x+1$.

For a vector $y=(y_0, y_1, \ldots, y_7)$ initializing the flip-flops 801, 802 as illustrated in FIG. 8 and as described with reference to FIG. 7 with $y_0, y_1, y_2, y_3$ and inputting ($y_4, y_5, y_6, y_7$) gives the output $S(y)=(s_0, s_1, s_2, s_3)$.

Figure 9:
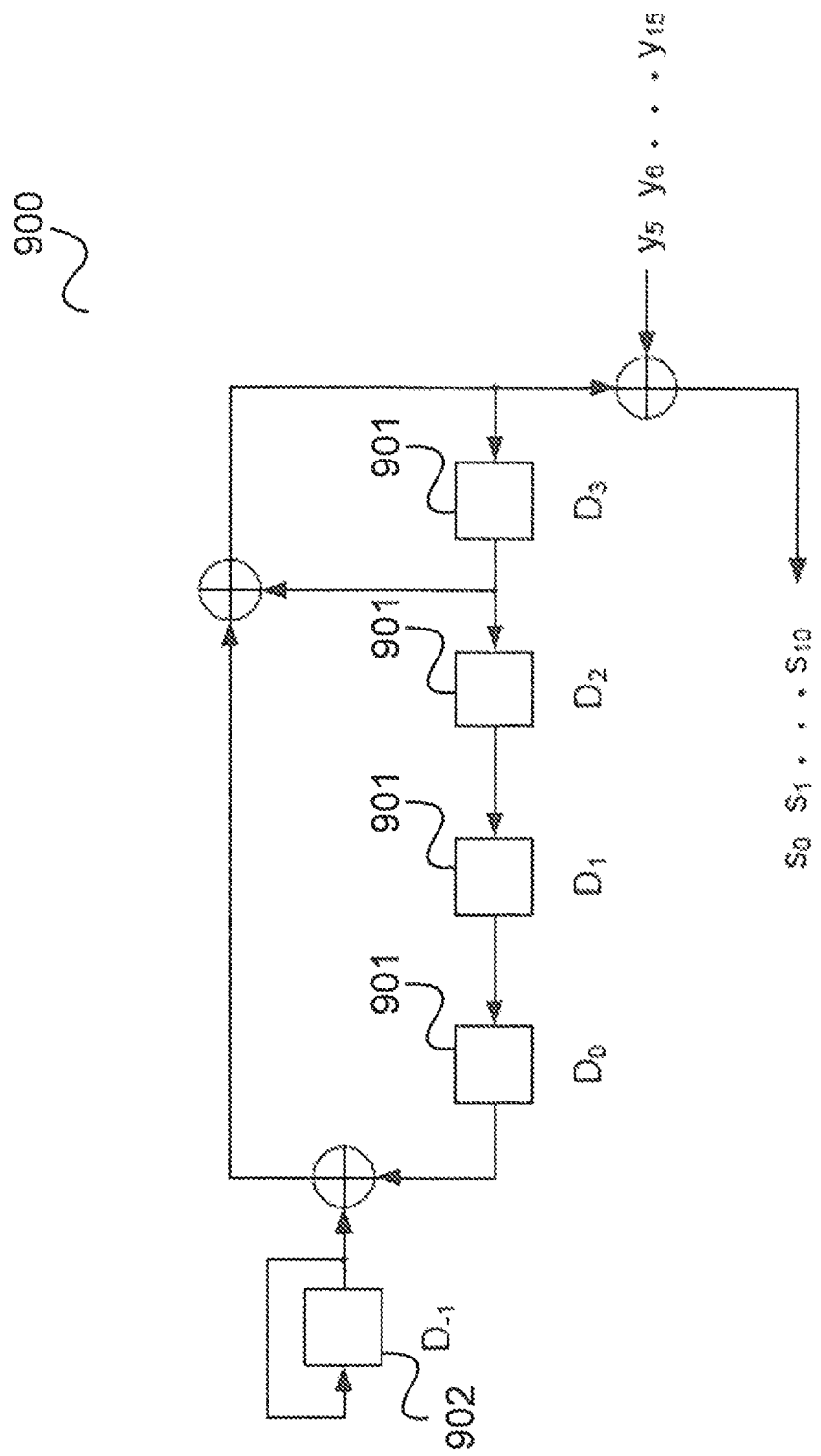
FIG. 9 shows an example of the syndrome generator of FIG. 7 for the (16, 32, 8) Reed-Muller code $R_4$.

FIG. 9 shows an example of the syndrome generator of FIG. 7 for the (16, 32, 8) Reed-Muller code $R_4$ defined by $f(x)=x^4+x^3+1$.

For a vector y=0010 0001 0110 1100 initializing the flip-flops 901, 902 as described with reference to FIG. 7 with 00100 and inputting 00101101100 gives the output S(y)= 01010111010.

For a vector y=1110 1010 0011 1011 initializing the flip-flops 901, 902 as described with reference to FIG. 7 with 11101 and inputting 01000111011 gives the output S(y)= 10000101111.

Figure 10:
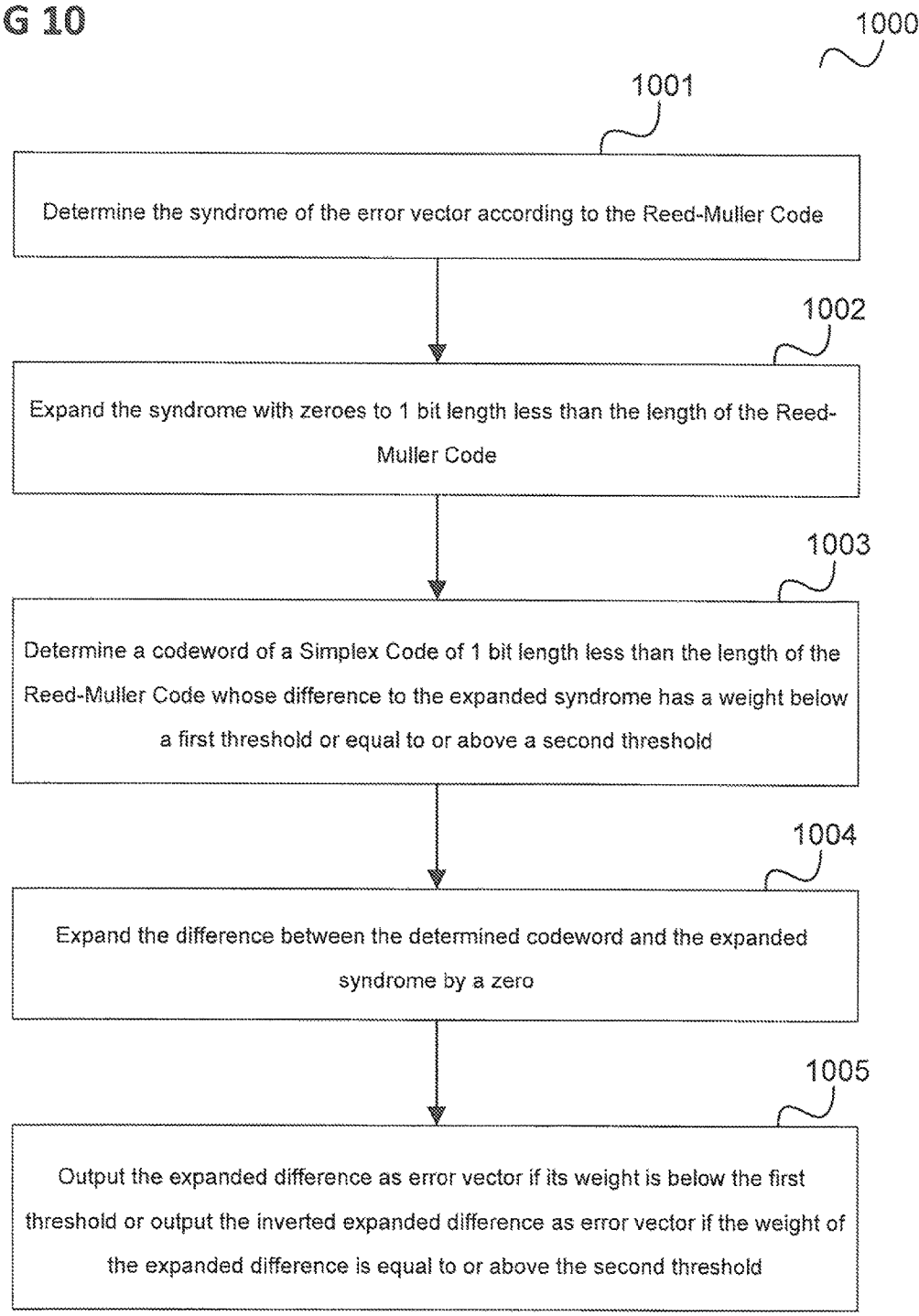
FIG. 10 shows a flow diagram illustrating a method for determining an error vector for a data word according to a Reed-Muller Code according to an embodiment.

According to one embodiment, a Type-I decoding scheme for the Reed-Muller code is provided as illustrated in FIG. 10.

FIG. 10 shows a flow diagram 1000 illustrating a method for determining an error vector for a data word according to a Reed-Muller Code.

In 1001, the syndrome of the error vector according to the Reed-Muller Code is determined, e.g. by means of a syndrome generator as illustrated in FIG. 7, for example applied to an erroneous code word, a PUF value or a biometric value (and, for example, by means of a subsequent addition of helper information).

In 1002, the syndrome is expanded with zeroes to 1 bit length less than the length of the Reed-Muller Code (e.g. by storing the syndrome in a register initialized with zeroes).

In 1003, a code word of a Simplex Code of 1 bit length less than the length of the Reed-Muller Code whose difference to the expanded syndrome has a weight below a first threshold or equal to or above a second threshold is determined.

In 1004, the difference between the determined (Simplex code) code word and the expanded syndrome is expanded by a zero.

In 1005, the expanded difference is output as error vector if its weight is below the first threshold or the inverted expanded difference is output as error vector if the weight of the expanded difference is equal to or above the second threshold.

According to one embodiment, in other words, a Simplex code code word is searched which itself or whose inverse is close to the (with zeroes expanded) syndrome of a received data word (meaning that the two vectors have a small Hamming distance). The difference between the Simplex code code word is then expanded by '0' or its inverse by a '1' to give the error vector of the data word.

This allows realization of a Type-I decoder with a similar efficiency and hardware complexity as the Type-II decoders of Reed and Green while typically being more suitable for biometric and PUF applications as described above.

The decoding method illustrated in FIG. 10 can be seen to be based on a construction of the Reed-Muller code by extending all code words of a Simplex Code by one bit and increasing the amount of code words by adding all binary complements of code words as additional code words. This for example allows implementing a decoder using linear feedback shift registers. Further, an encoder and a syndrome generator can be constructed in this way.

In the following, various embodiments are given.

Embodiment 1 is method for determining an error vector for a data word according to a Reed-Muller Code as illustrated in FIG. 1.

Embodiment 2 includes the method of embodiment 1, wherein the first threshold and the second threshold are predetermined thresholds.

Embodiment 3 includes the method of embodiment 1 or 2, wherein the second threshold is equal to the length of the Reed-Muller Code minus the first threshold.

Embodiment 4 includes the method of any one of embodiments 1 to 3, wherein the first threshold is equal to one fourth of the length of the Reed-Muller Code.

Embodiment 5 includes the method of any one of embodiments 1 to 3, wherein the first threshold is above one fourth of the length of the Reed-Muller Code and the method includes determining a plurality of code words of a Simplex Code of 1 bit length less than the length of the Reed-Muller Code whose difference to the expanded syndrome has a weight below a first threshold or equal to or above a second threshold, and includes, for each determined code word expanding the difference by a zero;

expanding the difference between the determined code word and the expanded syndrome by a zero;

outputting the expanded difference as error vector if its weight is below the first threshold or the inverted or outputting the inverted expanded difference as error vector if the weight of the expanded difference is equal to or above the second threshold.

Embodiment 6 includes the method of any one of embodiments 1 to 3, wherein the first threshold is the minimum for which there is exactly one code word of the Simplex Code whose difference to the expanded syndrome has a weight below the first threshold or equal to or above the length of the Reed-Muller Code minus the first threshold.

Embodiment 7 includes the method of any one of embodiments 1 to 6, including expanding the syndrome with leading zeroes to 1 bit length less than the length of the Reed-Muller Code.

Embodiment 8 includes the method of any one of embodiments 1 to 7, including expanding the difference between the determined code word and the expanded syndrome by a leading zero.

Embodiment 9 includes the method of any one of embodiments 1 to 6, wherein the error vector is an error vector for a data word being an erroneous code word of the Reed-Muller code.

Embodiment 10 includes the method of embodiment 9, including determining the syndrome of the data word as the syndrome of the error vector.

Embodiment 11 includes the method of any one of embodiments 1 to 6, wherein the error vector is an error vector for a data word being an erroneous PUF value or an erroneous biometric value.

Embodiment 12 includes the method of embodiment 11, including determining the sum of the syndrome of the erroneous PUF value or erroneous biometric value or and a predetermined syndrome of a correct PUF value or correct biometric value as the syndrome of the error vector.

Embodiment 13 includes the method of any one of embodiments 9 to 12, further including receiving the data word.

Embodiment 14 includes the method of embodiment 13, further including correcting the data word using the error vector.

Embodiment 15 includes the method of any one of embodiments 1 to 14, including determining the difference between the determined code word and the expanded syndrome by adding the determined code word and the expanded syndrome.

Embodiment 16 includes the method of any one of embodiments 1 to 15, including determining the syndrome by means of a linear feedback shift register.

Embodiment 17 includes the method of any one of embodiments 1 to 16, including determining the code word by storing a non-zero initial code word of the Simplex Code in a linear feedback shift register, generating one or more code words of the Simplex Code by cyclically shifting the initial code word and checking for each generated code word whether its difference to the expanded syndrome has a weight below a first threshold or equal to or above a second threshold.

Embodiment 18 includes the method of embodiment 17, including generating code words of the Simplex Code by cyclically shifting the initial code word until a code word whose difference to the expanded syndrome has a weight below the first threshold or equal to or above the second threshold has been found.

Figure 11:
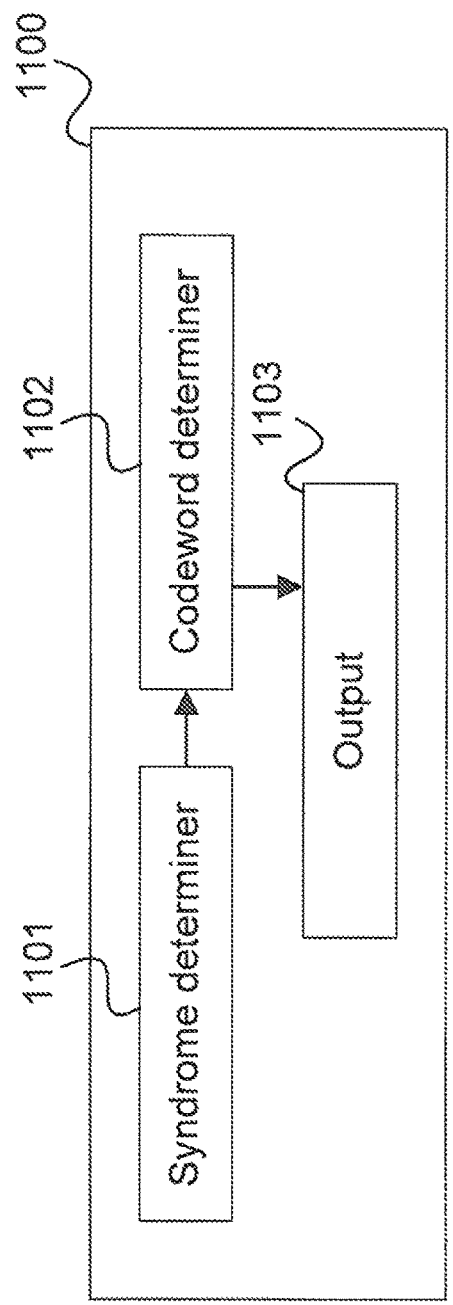
FIG. 11 shows a decoder for determining an error vector for a data word according to a Reed-Muller Code according to an embodiment.

The method for decoding a data word illustrated in FIG. 10 is for example carried out by a decoding circuit as illustrated in FIG. 11.

FIG. 11 shows a decoder 1100 for determining an error vector for a data word according to a Reed-Muller Code.

The decoder 1100 includes a syndrome determiner 1101 configured to determine the syndrome of the error vector according to the Reed-Muller Code and configured to expand the syndrome with zeroes to 1 bit length less than the length of the Reed-Muller Code.

The decoder 1100 further includes a code word determiner 1102 configured to determine a code word of a Simplex Code of 1 bit length less than the length of the Reed-Muller Code whose difference to the expanded syndrome has a weight below a first threshold or equal to or above a second threshold.

Further, the decoder 1100 includes an output 1103 configured to expand the difference between the determined code word and the expanded syndrome by a zero and configured to output the expanded difference as error vector if its weight is below the first threshold or output the inverted expanded difference as error vector if the weight of the expanded difference is equal to or above the second threshold.

It should be noted that the decoder and its components (e.g. the syndrome determiner, the code word determiner and the output) may for example be implemented by one or more circuits. A "circuit" may be understood as any kind of a logic implementing entity, which may be special purpose circuitry or a processor executing software stored in a memory, firmware, or any combination thereof. Thus a "circuit" may be a hard-wired logic circuit or a programmable logic circuit such as a programmable processor, e.g. a microprocessor. A "circuit" may also be a processor executing software, e.g. any kind of computer program. Any other kind of implementation of the respective functions which will be described in more detail below may also be understood as a "circuit". The decoder 1100 may for example be implemented in a chip card module of a chip card.

It should further be noted that embodiments described in context of the decoder 1100 are analogously valid in context of the method illustrated in FIG. 10 and vice versa.

In the following, embodiments of a Type-I Reed-Muller decoder and decoding method are described in more detail.

The distinguishing property between a Type-II and a Type-I decoder is that the former accepts a (potentially erroneous) code word as input while the later accepts the syndrome of the (potentially erroneous) code word as input.

In the following, a Type-I decoder (or syndrome decoder) for the Reed-Muller code $R_m$ according to an embodiment is described. As mentioned above, a Type-I decoder is typically preferred over a Type-II decoder in the context of PUF value reconstruction and the reconstruction of biometric data.

Figure 12:
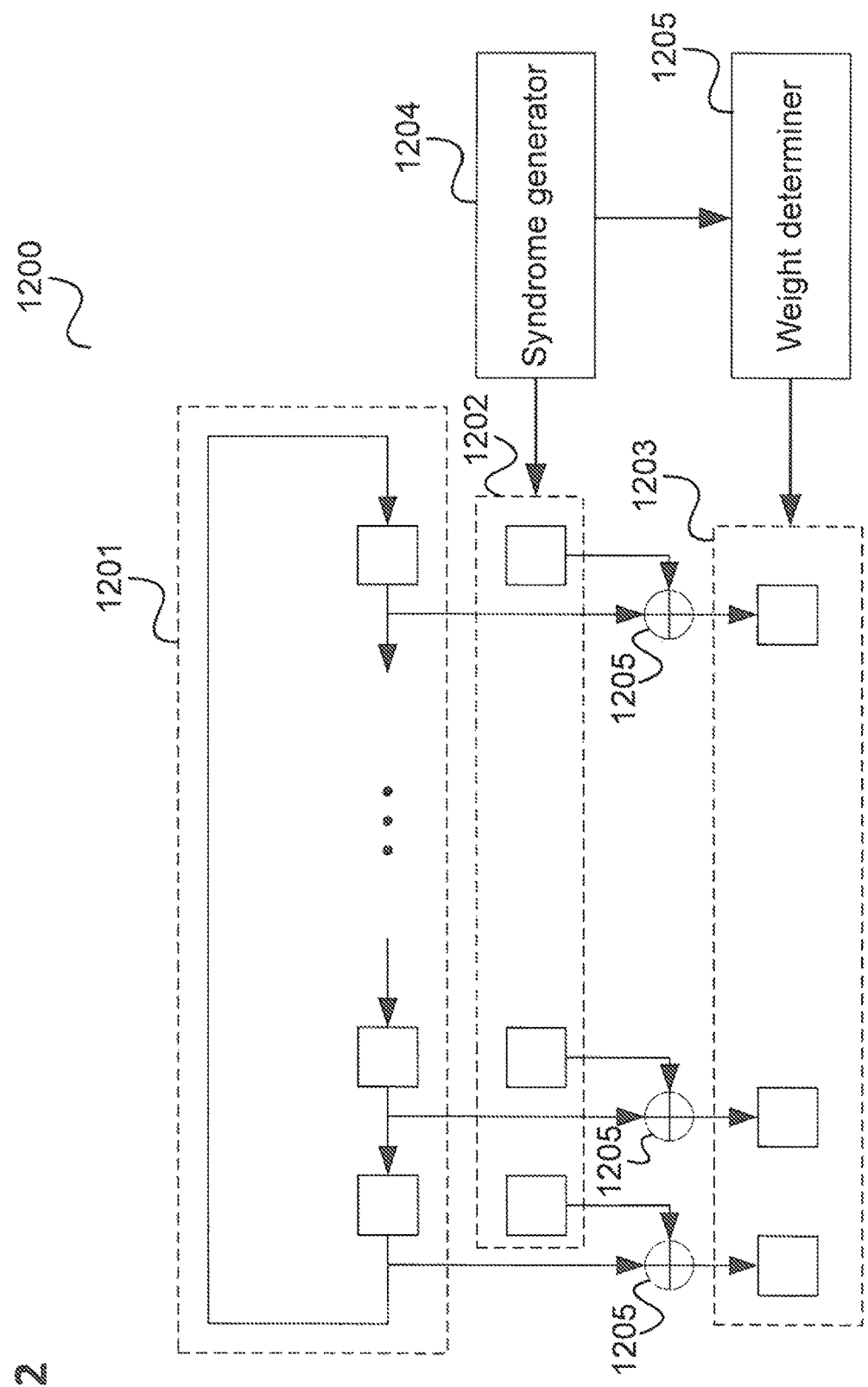
FIG. 12 shows a decoder according to an embodiment.

FIG. 12 shows a decoder 1200 according to an embodiment.

The decoder 1200 is a decoder for the $(2^m, 2^{m+1}, 2^{m-1})$ Reed-Muller code $R_m$ defined by the binary primitive polynomial $$f(x)=x^m+b_{m-1}x^{m-1}++b_1x+1.$$

The decoder 1200 includes a syndrome generator 1204, e.g. as described with reference to FIG. 7 (which may further include an addition of helper data for PUF or biometric applications), and a first register 1201, a second register 1202 and a third register 1203 of length $2^m-1$.

The first register 1201 is a shift register which shifts, in the illustration of FIG. 12, from right to left. The output of its leftmost flip-flop is connected to the input of its rightmost flip-flop such that the first register 1201 allows cyclically shifting its contents.

Each bit stored in a flip-flop of the first register 1201 may be added to the corresponding bit (i.e. the bit with the same index $0, \ldots, 2^m-2$) of the content of the second register 1202 by means of a respective adder 1205 (e.g. XOR) and the result is stored as the corresponding bit of the content of the third register 1203.

The first register 1201 is preloaded with the first $2^m-1$ terms of a nonzero linear recursive sequence that satisfies the linear recursion associated with the polynomial f(x). In other words, the first register 1201 contains a fixed nonzero code word of the simplex code $S_m$ associated with the given polynomial f(x), i.e. a code word of the Simplex code with a length of one bit less than the code length of the Reed-Muller code $R_m$.

Let $y=(y_0, y_1, \ldots, y_{n-1})$ be the received message vector of length $n=2^m$. The received message vector is fed to syndrome generator 1204 which computes the syndrome S(y) (possibly including an addition of auxiliary data for PUF or biometric value reconstruction). Next, the weight w(S(y)) of S(y) is determined e.g. by a weight determiner 1205 determining the number of 1's in the vector S(y). If $w(S(y))<2^{m-2}$, then the syndrome S(y) gives already the error vector e to be determined, namely $$e=(0,0,\ldots,0,S(y))$$

wherein the S(y) is preceded by m+1 zeros.

If $w(S(y)) \geq 2^{m-2}$ the vector $$(0,0,\ldots,0,S(y))$$

of length $2^m-1$, wherein S(y) is preceded by m zeros, is fed into the second register 1202.

Then, the following is carried out:

1) Compute the sum z of the two binary vectors stored in the first register 1201 and the second register 1202 bitwise and modulo 2 by means of adders 1205 and write result z into the third register 1203.

2) Determine the weight w(z), e.g. by weight determiner 1205 or another weight determiner. If $w(z)<2^{m-2}$ or $w(z) \geq 3 \cdot 2^{m-2}$, stop.

3) Otherwise, shift the vector in the first register 1201 cyclically one position to the left and go back to 1.

The process thus ends when a vector $z=(z_1, z_2, \ldots, z_{n-1})$ is stored in the third register 1203 where $n=2^m$ satisfying $w(z)<2^{m-2}$ or $w(z) \geq 3 \cdot 2^{m-2}$.

Then, the error vector e is given by $$e=(0,z)=(0,z_1,z_2,\ldots,z_{n-1}) \text{ if } w(z)<2^{m-2},$$

and $$e=(1,\bar{z})=(1,\bar{z}_1,\bar{z}_2,\ldots,\bar{z}_{n-1}) \text{ if } w(z) \geq 3 \cdot 2^{m-2}.$$

If the situation $w(z)<2^{m-2}$ or $w(z) \geq 3 \cdot 2^{m-2}$ never occurs while running through all $2^m-1$ cyclic shifts of the vector in the first register, at least n/4 of the bits $y_1, y_2, \ldots, y_{n-1}$ are in error. In this case, the decoding might be either impossible or super decoding as described further below may be applied.

Figure 13:
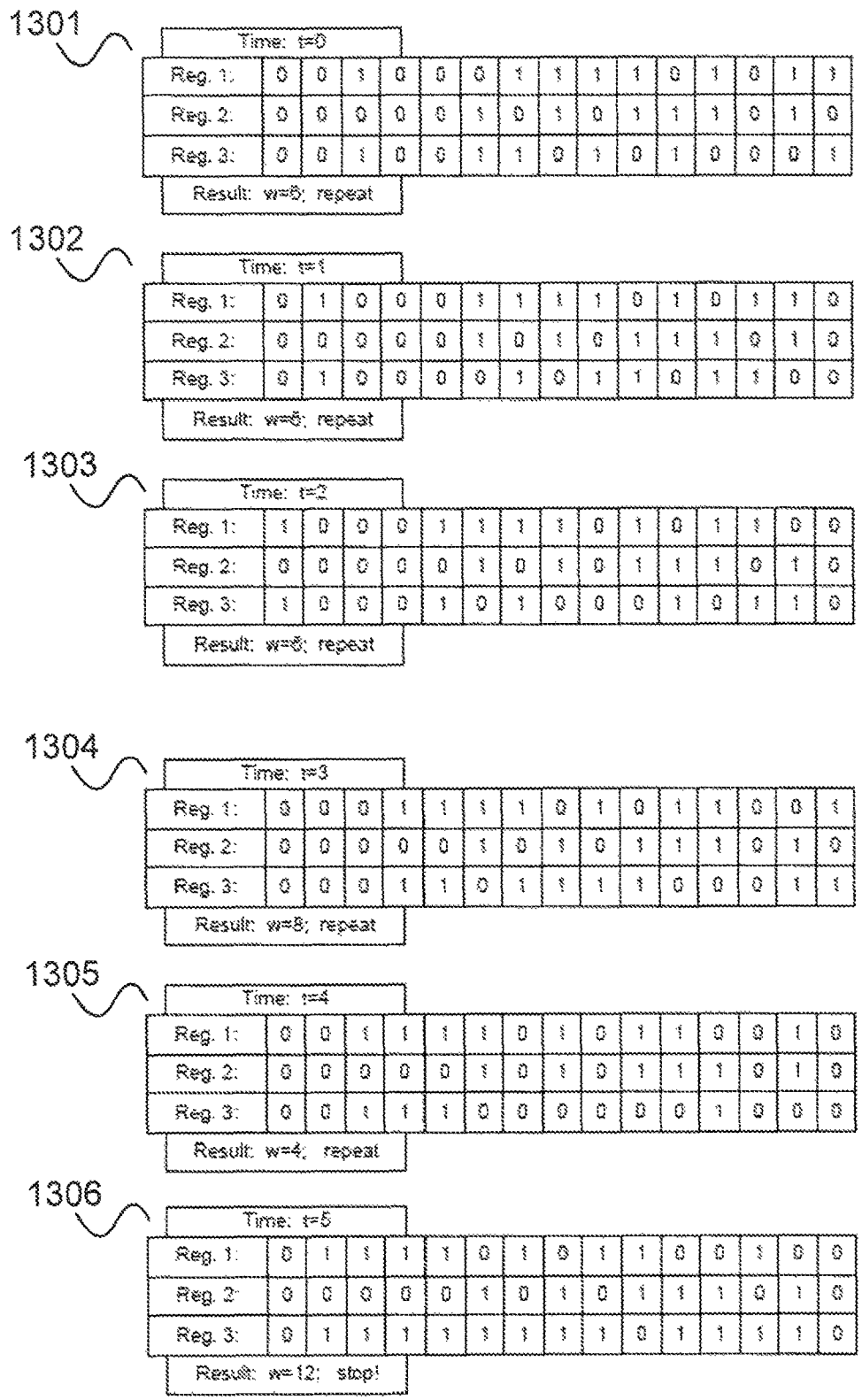
FIG. 13 gives an example of a decoding for the (16, 32, 8) Reed-Muller code.

FIG. 13 gives an example of a decoding for the (16, 32, 8) Reed-Muller code defined by $f(x)=x^4+x^3+1$ by the decoder 1200.

In FIG. 13, the contents of the first register (Reg. 1) 1201, the second register (Reg. 2) 1202 and the third register (Reg. 3) 1203 are given for six stages 1301 to 1306 (i.e. six iterations of 1) and 2) as described above) of the decoding.

Let the received data word be y=0010 0001 0110 1100. The syndrome generator 1205 gives S(y)=01010111010 (see the first example given with respect to FIG. 9) which is stored in the second register. The first register is initialized with the $S_m$ code word 001000111101011 and 1) and 2) as described above are carried out.

The first stage (time t=0) 1301 gives a vector z with w=6. Therefore, the content of the first register is cyclically shifted by one to the left and 1) and 2) are repeated.

The second stage (time t=1) 1302 gives a vector z with w=6. Therefore, the content of the first register is cyclically shifted by one to the left and 1) and 2) are repeated.

The third stage (time t=2) 1303 gives a vector z with w=6. Therefore, the content of the first register is cyclically shifted by one to the left and 1) and 2) are repeated.

The fourth stage (time t=3) 1301 gives a vector z with w=8. Therefore, the content of the first register is cyclically shifted by one to the left and 1) and 2) are repeated.

The fifth stage (time t=4) 1305 gives a vector z with w=4. Therefore, the content of the first register is cyclically shifted by one to the left and 1) and 2) are repeated.

The sixth stage (time t=5) 1306 gives a vector z with w=12. Since 12≥¾·16, the decoding is stopped and the error vector is given by e=1100 0000 0010 0001. In other words, the message bits $y_0$, $y_1$, $y_{10}$, and $y_{15}$ are erroneous.

FIG. 14 gives another example of a decoding for the (16, 32, 8) Reed-Muller code defined by $f(x)=x^4+x^3+1$ by the decoder 1200.

In FIG. 14, the contents of the first register (Reg. 1) 1201, the second register (Reg. 2) 1202 and the third register (Reg. 3) 1203 are given for a first stage 1401, a second stage 1402 and a seventh stage 1403 of the decoding (the third to sixth stages are not shown).

Let the received data word be y=1110 1010 0011 1011. The syndrome generator 1205 gives S(y)=10000101111 (see the second example given with respect to FIG. 9) which is stored in the second register. The first register is initialized with the $S_m$ code word 001000111101011 and 1) and 2) as described above are carried out.

The first stage (time t=0) 1401 gives a vector z with w=6. Therefore, the content of the first register is cyclically shifted by one to the left and 1) and 2) are repeated.

The second stage (time t=1) 1402 gives a vector z with w=10. Therefore, the content of the first register is cyclically shifted by one to the left and 1) and 2) are repeated.

The stop criterion is not fulfilled until the seventh stage (time t=6) 1303 which gives a vector z with w=12. Since 12≥¾·16, the decoding is stopped and the error vector is given by e=1000 0001 0001 1000 and the corrected data word is given by y+e=01101011 00100011.

As a further example, for the Reed-Muller code $R_m$ with m=4 with defining polynomial $f(x)=x^4+x^3+1$ let the slightly different message vector be now given by y=0110 1010 0011 1011.

Computing the syndrome of y gives S(y)=00100011000. Since $w(S(y))=3<2^{m-2}$, the error vector e is given by e=(0 0 0 0 0 S(y))=(0 0 0 0 0 0 0 1 0 0 0 1 1 0 0 0).

In the following, an embodiment using so-called super decoding is described.

For the $(2^m, 2^{m+1}, 2^{m-1})$ Reed-Muller code $R_m$ of length $n=2^m$ and minimum distance $d=2^{m-1}$, if less than $d/2=2^{m-2}$ errors occur in a received n-bit message vector y, the received message can be corrected. This can be guaranteed. In some cases, however, it is also possible to correct (i.e. decode) the message even when d/2 or more errors have occurred. The procedure to correct d/2 or more errors is called super decoding which is explained in the following.

In the Type-I decoder described above with reference 12 (also called syndrome decoder), the first register 1201 is loaded with a nonzero code word of the Simplex code $S_m$ and the second register 1202 is loaded with m zeroes followed by the syndrome S(y) of the received message vector y. The third register 1203 is loaded with the bitwise XOR sum z of the contents of the first register 1201 and the second register 1202 and next, the weight w(z) of z is computed.

As described above, by cyclically shifting the vector in the first register 1201 one position to the left, this procedure (i.e. 1) to 3) as described above) is repeated until in the third register 1203 a vector z is obtained satisfying $w(z)<2^{m-2}$ or $w(z)\geq 3\cdot 2^{m-2}$.

This vector z is used to form the error vector e=(0, z) or e=(1, $\bar{z}$), respectively and the decoding is then completed.

For super decoding using the decoder 1200 according to one embodiment, the procedure (i.e. 1) to 3) as described above) is performed $2^m-1$ times, for all possible cyclic shifts of the vector in the first register 1201. The corresponding vectors z in the third register 1203 are denoted by $z_0$, $z_1$, ..., $z_{n-2}$, where $n=2^m$. For each j=0, 1, ..., $2^m-2$, the minimum $b_j=\min(w(z_j), 2^m-1-w(z))$ is computed.

Next, the minimum β of the list B=[$b_0$, $b_1$, ..., $b_{n-2}$]. If the minimum β is uniquely determined, the message vector y can be corrected, wherein the minimum β is uniquely determined if it appears exactly once among the elements $b_0$, $b_1$, ..., $b_{n-2}$. This means that there exists some index k∈{0, 1, ..., $2^m-2$} with $b_k<b_1$ for all j∈{0, 1, ..., $2^m-2$} with j≠k.

If the minimum β is uniquely determined and equal to $b_k$ then the vector $z_k$ is taken:

If $w(z_k)<2^{m-1}=n/2$, the error vector e is given by e=(0, $z_k$).
If $w(z_k)>2^{m-1}=n/2$, the error vector is given by e=(1; $\bar{z_k}$).
The case $w(z_k)=n/2$ cannot occur: it is incompatible with the fact that the list B has a unique minimum.

FIG. 15A to FIG. 15C give an example of a super decoding for the Reed-Muller code $R_4$ defined by $f(x)=x^4+x^3+1$ by the decoder 1200.

In FIG. 15A to FIG. 15C, the contents of the first register (Reg. 1) 1201, the second register (Reg. 2) 1202 and the third register (Reg. 3) 1203 are given for $2^4-1=15$ stages 1501 to 1515 (i.e. 15 iterations of 1) and 2) as described above) of the decoding.

Let the received message vector be y=1110 1011 0100 0100. Computing the syndrome gives S(y)=10101010000 which is stored in the second register. The first register is initialized with the $S_m$ code word 001000111101011 and 1) and 2) as described above are carried out.

Each stage 1501 to 1515 corresponds to a time t=0, ..., 14.

Table 1 gives the weight w of the vector z for each stage 1501 to 1515 and the minimum of w and 15−w.

TABLE 1

| t | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| w | 8 | 6 | 8 | 4 | 8 | 6 | 10 | 6 | 10 | 8 | 10 | 8 | 10 | 6 | 8 |
| min(w, 15−w) | 7 | 6 | 7 | 4 | 7 | 6 | 5 | 6 | 5 | 7 | 5 | 7 | 5 | 6 | 7 |

The list B=[min($w(z_t)$, 15−$w(z_t)$): t=0, 1, ..., 14] is given by

B=[7, 6, 7, 4, 7, 6, 5, 6, 5, 7, 5, 7, 5, 6, 7]

and has the minimum 4 which is assumed only once, namely at t=3.

Thus, the vector $z_3$ gives the uniquely determined error vector e.

Since $w(z_3)=4<8$ e is given by $e=(0, z_3)=0000\ 1010\ 0000\ 1001$.

The corrected message vector is $c=y+e=1110\ 0001\ 0100\ 1101$:

FIG. 16A to FIG. 16C give another example of a super decoding for the Reed-Muller code $R_4$ defined by $f(x)=x^4+x^3+1$ by the decoder 1200.

In FIG. 16A to FIG. 16C, the contents of the first register (Reg. 1) 1201, the second register (Reg. 2) 1202 and the third register (Reg. 3) 1203 are given for $2^4-1=15$ stages 1601 to 1615 (i.e. 15 iterations of 1) and 2) as described above) of the decoding.

Let the received message vector be $y=1000\ 0101\ 0001\ 0010$. Computing the syndrome, gives $S(y)=00000100101$ which is stored in the second register. The first register is again initialized with the $S_m$ code word 001000111101011 and 1) and 2) as described above are carried out.

Each stage 1601 to 1615 corresponds to a time $t=0, \ldots, 14$.

Table 2 gives the weight w of the vector z for each stage 1501 to 1515 and the minimum of w and 15−w.

TABLE 2

| t | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| w | 7 | 9 | 7 | 9 | 9 | 7 | 11 | 9 | 7 | 7 | 7 | 9 | 5 | 9 | 5 |
| min(w; 15−w) | 7 | 6 | 7 | 6 | 6 | 7 | 4 | 6 | 7 | 7 | 7 | 6 | 5 | 6 | 5 |

The last row of table 2 represents the list B. The minimum of B is 4, and it is assumed only once: at t=6. Since $w(z_6)=11>8$, the uniquely determined error vector is given by $e=(1,z_6)=1000\ 0101\ 0001\ 0010$.

The decoded message vector reads $c=y+e=0000\ 0000\ 0000\ 0000$.

FIG. 17 gives a further example of a super decoding for the Reed-Muller code $R_4$ defined by $f(x)=x^4+x^3+1$ by the decoder 1200.

In FIG. 17, the contents of the first register (Reg. 1) 1201, the second register (Reg. 2) 1202 and the third register (Reg. 3) 1203 are given only for the first two stages 1701, 1702 of the $2^4-1=15$ stages (i.e. of the 15 iterations of 1) and 2) as described above) of the decoding.

Let the received message vector be $y=1000\ 0110\ 0100\ 0010$. Computing the syndrome, gives $S(y)=01101110101$ which is stored in the second register. The first register is again initialized with the $S_m$ code word 001000111101011 and 1) and 2) as described above are carried out.

As above, each stage corresponds to a time $t=0, \ldots, 14$.

Table 3 gives the weight w of the vector z for each stage and the minimum of w and 15−w.

TABLE 3

| t | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| w | 7 | 5 | 7 | 5 | 9 | 7 | 11 | 9 | 7 | 7 | 11 | 9 | 5 | 9 | 5 |
| min(w; 15−w) | 7 | 5 | 7 | 5 | 6 | 7 | 4 | 6 | 7 | 7 | 4 | 6 | 5 | 6 | 5 |

The last row of table 3 shows that the minimum of the list B is 4, which, in this case, is assumed twice: at t=6 and at t=10. Therefore, the error vector is not uniquely determined. The message y cannot be corrected.

Error vector determination as described above may for example applied on a chip card, e.g. for PUF reconstruction.

Figure 18:
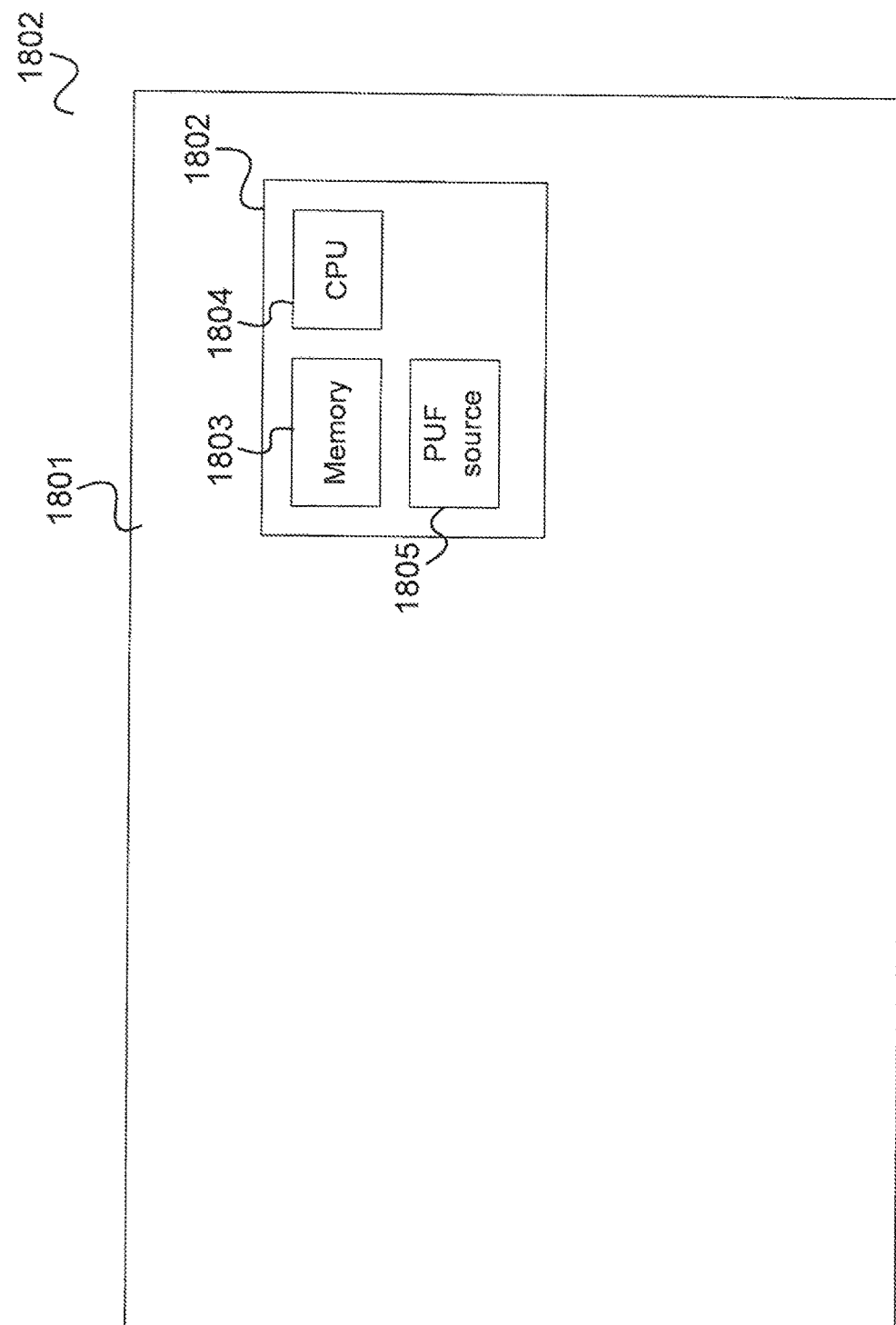
FIG. 18 shows a chip card.

FIG. 18 shows a chip card 1800.

The chip card 1800 includes a carrier 1801 and a chip card module 1802. The chip card module 1802 has various components like a non-volatile memory 1803 and a CPU (Central Processing Unit) 1804. In various embodiments, the chip card includes a component 1805 which serves as PUF source, for example a memory (e.g. including a multiplicity of SRAM cells) whose random initial state is used as PUF value.

The PUF value can for example be considered as an identification number for the chip card 1800 (more specifically for the chip card module 1802 in the chip card 1800). For example, the chip card module 1802 includes a crypto processor which derives a cryptographic key which is specific for the chip card from this identification number or the CPU 1804 itself derives a cryptographic key from it. For a repeated derivation of a cryptographic key, the chip card module 1802 may apply error vector determination as described above for reconstructing a PUF value.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A modified Type-I-decoder method for determining an error vector for an erroneous Physical Unclonable Function or erroneous Biometric Data according to a first-order Reed-Muller Code, the method comprising:

receiving a data word of length m, the data word being an erroneous Physical Unclonable Function or an erroneous Biometric Data;

determining the syndrome of the error vector according to the first order Reed-Muller Code, said first order Reed-Muller code being length $2^m$;

expanding the syndrome with zeroes to 1 bit length less than the length of the first order Reed-Muller Code;

determining a code word of a Simplex Code of 1 bit length less than the length of the first order Reed-Muller Code, wherein a difference between the code word of the Simplex code and the expanded syndrome has a weight either less than a first threshold or greater than or equal to a second threshold;
expanding the difference between the determined code word and the expanded syndrome by a zero; and
outputting an error vector corresponding to the expanded difference if the weight of the expanded difference is less than the first threshold or outputting an error vector corresponding to an inverted expanded difference if the weight of the expanded difference is equal to or above the second threshold;
wherein the modified Type-I decoder differs from a conventional Type-I decoder at least in that the modified Type-I decoder is configured to derive the first-order Reed Muller code from the simplex code and without necessitating a random number generator.

2. The method of claim 1,
wherein the first threshold and the second threshold are predetermined thresholds.

3. The method of claim 1,
wherein the second threshold is equal to the length of the first order Reed-Muller Code minus the first threshold.

4. The method of claim 1,
wherein the first threshold is equal to one fourth of the length of the first order Reed-Muller Code.

5. The method of claim 1,
wherein the first threshold is the minimum for which there is only one code word of the Simplex Code for which the code word's difference from the expanded syndrome either has a weight below the first threshold or is greater than or equal to the length of the first order Reed-Muller Code minus the first threshold.

6. The method of claim 1, further comprising:
expanding the syndrome with leading zeroes to 1 bit length less than the length of the first order Reed-Muller Code.

7. The method of claim 1, further comprising:
expanding the difference between the determined code word and the expanded syndrome by a leading zero.

8. The method of claim 1,
wherein the error vector is an error vector for a data word being an erroneous code word of the first order Reed-Muller code.

9. The method of claim 8, further comprising:
determining the syndrome of the data word as the syndrome of the error vector.

10. The method of claim 8, further comprising:
receiving the data word.

11. The method of claim 10, further comprising:
correcting the data word using the error vector.

12. The method of claim 1, further comprising:
determining the difference between the determined code word and the expanded syndrome by adding the determined code word and the expanded syndrome.

13. The method of claim 1, further comprising:
determining the syndrome by means of a linear feedback shift register.

14. The method of claim 1, further comprising:
determining the code word by storing a non-zero initial code word of the Simplex Code in a linear feedback shift register, generating one or more code words of the Simplex Code by cyclically shifting the initial code word and checking for each generated code word whether its difference from the expanded syndrome has a weight below a first threshold or equal to or above a second threshold.

15. The method of claim 14, further comprising:
generating code words of the Simplex Code by cyclically shifting the initial code word until a code word for which a difference from the expanded syndrome having a weight below the first threshold or equal to or above the second threshold has been found.

16. A chip card for modified Type-I-decoder determination of an error vector for an erroneous Physical Unclonable Function or erroneous Biometric Data according to a first-order Reed-Muller Code, the chip card comprising:
a memory, configured to store a Physical Unclonable Function or Biometric Data;
a syndrome determiner configured to receive from the memory a data word of length m, the data word corresponding to the erroneous Physical Unclonable Function or the erroneous Biometric Data;
determine the syndrome of the error vector according to the first-order Reed-Muller Code and configured to expand the syndrome with zeroes to 1 bit length less than the length of the first-order Reed-Muller Code, said first-order Reed-Muller code being of length $2^m$;
a code word determiner configured to determine a code word of a Simplex Code of 1 bit length less than the length of the first-order Reed-Muller Code wherein a difference between the code word of the Simplex code and the expanded syndrome has a weight either less than a first threshold or greater than or equal to a second threshold; and
an output configured to expand the difference between the determined code word and the expanded syndrome by a zero and to either output an error vector corresponding to the expanded difference if the weight of the expanded difference is less than the first threshold, or to output an error vector corresponding to an inverted expanded difference if the weight of the expanded difference is equal to or above the second threshold
wherein the modified Type-I decoder determination differs from a conventional Type-I decoder determination at least in that the modified Type-I decoder determination derives the first-order Reed Muller code from the simplex code and without necessitating a random number generator.

17. A decoder for modified Type-I-decoder determination of an error vector for an erroneous Physical Unclonable Function or erroneous Biometric Data according to a Reed-Muller Code, the decoder comprising:
a syndrome determiner comprising m flip-flops, m being equal to a length of the data word, said m flip-flops being connected to a shift register, the syndrome determiner being configured to determine the syndrome of the error vector according to the Reed-Muller Code and configured to expand the syndrome with zeroes to 1 bit length less than the length of the Reed-Muller Code;
a code word determiner configured to determine a code word of a Simplex Code of 1 bit length less than the length of the Reed-Muller Code wherein a difference between the code word of the Simplex code and the expanded syndrome has a weight either less than a first threshold or greater than or equal to a second threshold; and
an output configured to expand the difference between the determined code word and the expanded syndrome by a zero and to either output an error vector corresponding to the expanded difference if the weight of the expanded difference is less than the first threshold, or to output an error vector corresponding to an inverted expanded difference if the weight of the expanded difference is equal to or above the second threshold;

wherein syndrome is $2^m$ bits in length, wherein the code word is $2^m$ in length, wherein the flip-flops are initiated with bits corresponding to the error vector, and wherein the syndrome determiner is configured to determine the syndrome by clocking the syndrome determiner $2^m-m-1$ times wherein the modified Type-I decoder determination differs from a conventional Type-I decoder determination at least in that the modified Type-I decoder determination derives the first-order Reed Muller code from the simplex code and without necessitating a random number generator.

* * * * *